US009071244B2

(12) United States Patent
Poulton et al.

(10) Patent No.: US 9,071,244 B2
(45) Date of Patent: *Jun. 30, 2015

(54) GROUND REFERENCED SINGLE-ENDED SIGNALING

(71) Applicant: NVIDIA Corporation, Santa Clara, CA (US)

(72) Inventors: John W. Poulton, Chapel Hill, NC (US); Thomas Hastings Greer, III, Chapel Hill, NC (US); William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/055,823

(22) Filed: Oct. 16, 2013

(65) Prior Publication Data

US 2014/0044159 A1 Feb. 13, 2014

Related U.S. Application Data

(63) Continuation of application No. 13/359,433, filed on Jan. 26, 2012, now Pat. No. 8,611,437.

(51) Int. Cl.
*H04L 25/08* (2006.01)
*H03K 17/16* (2006.01)
*H04B 1/04* (2006.01)
(Continued)

(52) U.S. Cl.
CPC ............. *H03K 17/16* (2013.01); *H04B 1/04* (2013.01); *H04L 25/0274* (2013.01); *H04L 25/028* (2013.01); *H04L 25/0292* (2013.01); *H04L 25/03878* (2013.01)

(58) Field of Classification Search
USPC ................ 375/257, 288, 295, 296, 309, 312
See application file for complete search history.

(56) References Cited

U.S. PATENT DOCUMENTS

| 6,125,047 A * | 9/2000 | Janz ............................. 363/60 |
| 7,962,115 B2 | 6/2011 | Huang et al. |
| 8,102,157 B2 * | 1/2012 | Abe ............................. 320/166 |

(Continued)

FOREIGN PATENT DOCUMENTS

| CN | 1324514 A | 11/2001 |
| CN | 1647381 A | 7/2005 |

OTHER PUBLICATIONS

Poulton, J. W. et al., "A 0.54pJ/b 20Gb/s Ground-Referenced Single-Ended Short-Haul Serial Link in 28nm CMOS for Advanced Packaging Applications," 2013 IEEE International Solid-State Circuits Conference, Feb. 17-21, 2013, pp. 404-405.

(Continued)

*Primary Examiner* — Siu Lee
(74) *Attorney, Agent, or Firm* — Zilka-Kotab, PC

(57) ABSTRACT

One embodiment of the present invention sets forth a mechanism for transmitting and receiving ground-referenced single-ended signals. A transmitter combines a direct current (DC) to DC converter including a flying capacitor with a 2:1 clocked multiplexer to drive a single-ended signaling line. The transmitter drives a pair of voltages that are symmetric about the ground power supply level. Signaling currents are returned to the ground plane to minimize the generation of noise that is a source of crosstalk between different signaling lines. Noise introduced through the power supply is correlated with the switching rate of the data and may be reduced using an equalizer circuit.

20 Claims, 29 Drawing Sheets

(51) Int. Cl.
*H04L 25/02* (2006.01)
*H04L 25/03* (2006.01)

(56) References Cited

U.S. PATENT DOCUMENTS

| | | | |
|---|---|---|---|
| 8,395,410 B2 | 3/2013 | Hatori | |
| 8,538,558 B1 | 9/2013 | Sabapathy et al. | |
| 8,583,953 B2 | 11/2013 | Sultenfuss | |
| 8,611,437 B2 * | 12/2013 | Poulton et al. | 375/257 |
| 8,621,131 B2 | 12/2013 | Loh et al. | |
| 8,710,920 B2 | 4/2014 | Huang | |
| 8,854,123 B1 | 10/2014 | Dally et al. | |
| 2002/0104035 A1 | 8/2002 | Burns et al. | |
| 2003/0185067 A1 | 10/2003 | Dellow | |
| 2003/0208668 A1 | 11/2003 | To et al. | |
| 2004/0114650 A1 | 6/2004 | Tanaka et al. | |
| 2005/0207234 A1 | 9/2005 | Baechtold et al. | |
| 2006/0232311 A1 | 10/2006 | Kitayama | |
| 2007/0159488 A1 | 7/2007 | Danskin et al. | |
| 2007/0210835 A1 * | 9/2007 | Aghtar | 327/94 |
| 2007/0211711 A1 | 9/2007 | Clayton | |
| 2008/0189457 A1 | 8/2008 | Dreps et al. | |
| 2008/0212347 A1 * | 9/2008 | Mok et al. | 363/60 |
| 2008/0311702 A1 | 12/2008 | Wark | |
| 2009/0002066 A1 * | 1/2009 | Lee et al. | 327/554 |
| 2009/0031078 A1 | 1/2009 | Warnes et al. | |
| 2009/0189681 A1 * | 7/2009 | Ivanov et al. | 327/536 |
| 2010/0046266 A1 | 2/2010 | Bruennert et al. | |
| 2010/0202202 A1 | 8/2010 | Roohparvar | |
| 2010/0220541 A1 * | 9/2010 | Gebara et al. | 365/226 |
| 2011/0128071 A1 | 6/2011 | Fukusen et al. | |
| 2011/0199122 A1 | 8/2011 | Morishita et al. | |
| 2011/0233741 A1 | 9/2011 | Ishii et al. | |
| 2011/0309475 A1 | 12/2011 | Lee | |
| 2012/0102260 A1 | 4/2012 | Kawamura et al. | |
| 2012/0163071 A1 | 6/2012 | Kurokawa | |
| 2013/0166519 A1 | 6/2013 | Matsuse | |
| 2013/0188422 A1 | 7/2013 | Kim et al. | |
| 2013/0194031 A1 | 8/2013 | Poulton et al. | |
| 2013/0328597 A1 | 12/2013 | Cassia | |
| 2014/0036596 A1 | 2/2014 | Chan et al. | |
| 2014/0091834 A1 | 4/2014 | Chi | |
| 2014/0266416 A1 | 9/2014 | Dally et al. | |
| 2014/0266417 A1 | 9/2014 | Dally et al. | |
| 2014/0268976 A1 | 9/2014 | Dally et al. | |
| 2014/0269010 A1 | 9/2014 | Dally | |
| 2014/0269011 A1 | 9/2014 | Dally et al. | |
| 2014/0269012 A1 | 9/2014 | Dally et al. | |
| 2014/0281383 A1 | 9/2014 | Dally et al. | |

OTHER PUBLICATIONS

Office Action from Chinese Patent Application No. 201210457686.8, dated Jul. 23, 2014.
Final Office Action from U.S. Appl. No. 13/361,843, dated Oct. 18, 2013.
Non-Final Office Action from U.S. Appl. No. 13/361,843, dated Jan. 5, 2015.
Non-Final Office Action from U.S. Appl. No. 13/361,843, dated Aug. 13, 2013.
Non-Final Office Action from U.S. Appl. No. 13/361,843, dated Mar. 27, 2013.
Non-Final Office Action from U.S. Appl. No. 13/844,570, dated Oct. 3, 2014.
Non-Final Office Action from U.S. Appl. No. 13/890,899, dated Dec. 4, 2014.
Non-Final Office Action from U.S. Appl. No. 13/973,947, dated Feb. 4, 2015.
Notice of Allowance from U.S. Appl. No. 13/946,980, dated Jun. 9, 2014.
Non-Final Office Action from U.S. Appl. No. 13/938,161, dated Dec. 4, 2014.
Notice of Allowance from U.S. Appl. No. 13/933,058, dated Oct. 15, 2014.
Non-Final Office Action from U.S. Appl. No. 13/933,058, dated Jun. 27, 2014.
Non-Final Office Action from U.S. Appl. No. 13/973,952, dated Jan. 22, 2015.
Notice of Allowance from U.S. Appl. No. 13/933,058, dated Feb. 23, 2015.
Office Action from Taiwan Patent Application No. 101136888, dated Mar. 5, 2015.
Office Action from Chinese Patent Application No. 201210459107.3, dated Apr. 16, 2015.
Notice of Allowance from U.S. Appl. No. 13/844,570, dated Mar. 19, 2015.
Office Action from Taiwan Patent Application No. 101136887, dated May 4, 2015.
Notice of Allowance from U.S. Appl. No. 13/890,899, dated May 14, 2015.

* cited by examiner

GROUND REFERENCED SINGLE-ENDED SIGNALING

CLAIM OF PRIORITY

This application is a continuation of U.S. application Ser. No. 13/359,433, filed Jan. 26, 2012, which is incorporated herein by reference in its entirety.

BACKGROUND OF THE INVENTION

1. Field of the Invention

The present invention generally relates to transmitting signals between discrete integrated circuit devices and more specifically to single-ended signaling techniques.

2. Description of the Related Art

Single-ended signaling systems employ a single signal conductor per bit stream to be transmitted from one integrated circuit device (chip) to another chip. By way of contrast, differential signaling systems explicitly require two signal conductors, so single-ended signaling is often assumed to be an advantage in cases where the number of off-chip pins and signal conductors is limited by packaging constraints.

However, single-ended signaling systems actually require more circuitry per channel than just one signal conductor. The current that flows from transmitter to receiver must be returned to the transmitter to form a complete electrical circuit, and in single-ended signaling systems the current that is returned flows over a set of shared conductors, typically the power supply terminals, In order to keep the return current flow physically close to the signal conductor, the shared return terminals are usually physical planes in the packaging, e.g., chip package or printed circuit board, allowing the signal conductors to be constructed as strip-lines or micro-strips. Therefore, single-ended signaling systems always require >N pins and conductors to carry N bit streams between chips, and this overhead is typically on the order of 10-50%.

Single-ended signaling systems require a reference voltage at the receiver in order for the receiver to distinguish between (typically) the two signal levels that represent a "0" and "1". By contrast, differential signaling systems do not require a reference voltage: the receiver need only compare the voltages on the two symmetric conductors of the differential signaling system to distinguish the data value. There are many ways to establish a reference voltage for a single-ended signaling system. However, it is fundamentally difficult to ensure agreement on the value of the reference voltage between transmitter and receiver and agreement is needed to ensure consistent interpretation of the signals sent by the transmitter to the receiver.

Single-ended signaling systems dissipate more power for a given signal-to-noise ratio compared with equivalent differential signaling systems. In the case of resistively terminated transmission lines, a single-ended system must drive a current of $+V/R_0$ to establish a voltage V above the reference voltage at the receiver for a transmitted "1", and sink current $-V/R_0$ to establish a voltage of V below the reference voltage at the receiver for a "0", where $R_0$ is the termination resistance. Thus the system consumes a current of $2V/R_0$ to establish the required signal at the receiver. In comparison, when differential signaling is used, the transmitter only need drive current of $\pm V/2R_0$ to establish the same voltage (V) across the receiver terminals, thanks to the symmetric pair of signal conductors. A differential signaling system only needs to draw $V/R_0$ of current from the power supply. Therefore, even assuming a reference voltage at the receiver that is perfectly matched to the transmitter, single-ended signaling systems are fundamentally half as power-efficient as differential ones.

Finally, single-ended systems are more susceptible to externally coupled noise sources compared with differential systems. For example, if noise is electromagnetically coupled to a signal conductor of a single-ended system, the voltage that arises from this coupling arrives as un-cancelled noise at the receiver. The noise budget for the signaling system must therefore account for all such noise sources. Unfortunately, such noise coupling is often from neighboring wires in a bundle of single-ended signals, called cross-talk, and this noise source is proportional to the signal voltage level, and therefore cannot be overcome by increasing the signal level. In differential signaling, the two symmetric signal conductors can be run physically close to one another between a transmitter and receiver so that noise is coupled symmetrically into both conductors. Thus many external noise sources affect both lines approximately identically, and this common-mode noise can be rejected at a receiver that has higher differential gain than common-mode gain.

Accordingly, what is needed in the art is a technique for providing single-ended signaling while reducing the problems of establishing a reference voltage, reducing the shared impedance of the signal return path and crosstalk caused by the signal return path, and reducing the power consumption of the single-ended signaling system.

FIG. 1A shows an example prior art single-ended signaling system 100, sometimes called a "pseudo-open-drain" (PODL) system that illustrates the reference voltage problem. Single-ended signaling system 100 includes a transmitting device 101 and a receiving device 102. The transmitting device 101 operates by drawing current Is from the power supply when sending a "0", and drawing no current when sending a "1" (allowing the terminating resistors R0 and R1 to pull the signal up to Vdd). To develop a signal of magnitude |V| at the receiving device 102, the signal swing must be 2V, so current Is=2V/(R0/2) when driving a "0", and 0 otherwise. Averaged over an equal number of "1's" and "0's", the system consumes 2V/R0 from the power supply.

The signal at the input of the receiving device 102 swings from Vdd ("1") down to Vdd-2V ("0"). To distinguish the received data, the receiving device 102 needs a reference voltage of Vref=Vdd-V. There are three ways to generate the reference voltage as shown in FIGS. 1A, 1B, and 1C.

As shown in FIG. 1A, an external reference voltage Vref is generated by a resistor network located close to the receiving device. The external reference voltage passes into the receiving device through a dedicated pin 103 and is distributed to some number of receivers that share the external reference voltage. A first problem with the external reference voltage technique shown in FIG. 1A, is that the external reference voltage is developed across external resistors R2a and R2b between the power supply terminals Vdd and GND, and that the generated external reference voltage cannot be matched with the voltage developed by the current sources in the transmitting device 101, since the current sources are completely uncorrelated with the external resistors R2a and R2b.

A second problem is that the power supply voltage at the receiving device 102 may be different from the power supply voltage at the transmitting device 101, since the supply networks to the two communicating chips have different impedances, and the two chips draw different, and variable, currents. A third problem is that noise injected into any one of the signaling wires 105 coupling the transmitting device 101 to the receiving device 102 is not injected into the reference voltage, and therefore the signaling system must budget for the worst case noise voltage that may be introduced to the signaling wires 105. A fourth problem is that the voltage level between the external power supply terminals Vdd and GND differs from the internal power supply network within the receiving device 102, again because of the supply impedance. Furthermore, the configuration of the single-ended signaling system 100 causes the currents in the shared supply terminals to be data dependent, Thus, any data dependent noise that is introduced to the inputs of the internal receiver amplifiers within the receiving device 102 differs from the external supply noise that is introduced to the shared external reference voltage that is also input to the internal receiver amplifiers.

FIG. 1B shows an example prior art single-ended signaling system 120, that uses an internal reference voltage. The internal reference voltage Vref attempts to improve on the noise problems compared with the single-ended signaling system 100 that uses an external reference voltage. The single-ended signaling system 120 also tracks the reference voltage level of the transmitting device 121 more closely compared with the single-ended signaling system 100. A scaled transmitter is included in the receiver circuitry of the receiving device 122 that generates an internal Vref that is related to the termination resistance and the transmitter current Is. Because the internal reference voltage is generated relative to the internal power supply network, the internal reference voltage does not suffer the supply-noise problems of the external voltage reference shown in FIG. 1A. However, the noise coupling problems of the external reference voltage approach described in conjunction with FIG. 1A remain. Further, because the current source (Is/2) used to generate the internal reference voltage is in a different chip than the current sources in the transmitting device 121, the current source in the receiving device 122 may not track the current sources in the transmitting device 121.

FIG. 1C shows an example prior art single-ended signaling system 130, that uses a bundled reference voltage Vref. Tracking between the bundled reference voltage and signal voltages is improved because the bundled reference voltage is generated in the transmitting device 131 using a scaled transmitter and the bundled reference voltage is coupled to the same internal supply network as the data transmitters in the transmitting device 131. Therefore, the bundled reference voltage can be made to track the transmitter device's 131 process-voltage-temperature variations reasonably well. The bundled reference voltage is transmitted from the transmitting device 131 to the receiving device 132 over a wire that is parallel to and as identical as possible to the signaling wires 135 that transmit the data.

External noise that may be coupled into the system, including some components of power supply noise, can be cancelled since the external noise appears as common-mode noise between the bundled reference voltage and any given signal of signaling wires 135. Cancellation of the common-mode noise cannot be perfectly effective however, because the bundled reference voltage has terminating impedance at the receiving device 132 that is different from a data signal; since the bundled reference voltage must be fanned out to a large number of receivers, the capacitance on the pin receiving Vref is always larger than on a typical signal pin, so noise is low-passed, relative to a data signal.

FIG. 2A shows the current flow in a prior art single-ended signaling system 200 in which the ground plane is intended to be the shared signal return conductor. Single-ended signaling system 200 illustrates the previously described return impedance problem. As shown in FIG. 2A, the single-ended signaling system 200 is transmitting a "0" by sinking current at the transmitting device 201. Half of the current flows out over the signal conductor (the signal current flow 204), and the other half, the transmitter current flow 203, flows through the terminator of the transmitting device 201. In this example, the return current is intended to flow in the ground (GND) plane, and if the signal conductors are referred to the ground plane, and no other supply, electromagnetic coupling between signal and ground plane will cause image currents to flow in the ground plane immediately below the signal conductor. In order to achieve a 50/50 current split at the transmitter, a path for the transmitter's local current, transmitter current flow 203 through the terminating resistor 206 to return to the ground is provided by an internal bypass capacitor 205 in the transmitting device 201. The signal current 204 is returned to the receiving device 202 through the ground plane and is intended to flow into receiving device 202 through its bypass capacitor 207 and internal terminating resistor 208.

FIG. 2B shows the current flow in the prior art single-ended signaling system 200 in which the ground plane is intended to be the shared signal return conductor when a "1" is transmitted from the transmitting device 201 to the receiving device 202. The current source in the transmitting device 201 is off (and is not shown), and the terminating resistor 206 within the transmitting device 201 pulls the line HI. Again, the return current is intended to flow in the ground plane, so the bypass capacitor 215 in the transmitting device 201 is required to carry the signal current flow 214. The current path in the receiving device 202 is the same as for transmitting a "0", as shown in FIG. 2A, apart from direction of transmitted current flow.

There are several problems with scenario shown in FIGS. 2A and 2B. First, if the impedance of the bypass capacitors 205 and 215 is not low enough, some of the signal current will flow in the Vdd network. Any redirected current flowing through the Vdd network will somehow have to rejoin the image current in the ground network, and to reach the ground plane the redirected current will have to flow through external bypass capacitors and other power supply shunt impedances.

Second, the return current flows through the impedance of the shared ground network 211 at the transmitting device 201 and the shared ground impedance 212 at the receiving device 202. Since ground is a shared return path, the signal current produces a voltage across the ground network impedances 211 and 212. At the receiving device 202, the voltage across the ground network impedances 211 and 212 produces noise in neighboring signal paths, providing a direct source of crosstalk.

Third, if the shared ground return pin is some distance from the signal pin for which the ground pin provides a return path, there is an inductance associated with the current loop that is formed, increasing the effective ground impedance, and exacerbating the cross-talk between signals that share the ground pin. In addition, the inductance is in series with the terminator and will cause reflections in the signaling channels, yet another source of noise.

Finally, the current flow shown in FIGS. 2A and 2B is the transient flow that occurs when a data edge is transmitted. The steady-state flow is quite different, in both cases, since the current must flow through the power supply over both the Vdd and ground networks. Since the steady-state current path is different from the transient one, there is a transition between the two conditions in which transient current flows in both Vdd and ground networks, dropping voltages across the supply impedances, and generating more noise.

One may assume that it is preferable to use the Vdd network to carry the return currents, since the termination resistances are connected to this network. This choice would not solve the basic problem, however. The bypass capacitors 205 and 215 are still needed to route transient signal currents, and the transient and steady-state conditions still differ, so there is still cross-talk from shared supply impedances, and voltage noise from data transitions. The fundamental problems are two-fold: first, the shared supply impedances are a source of cross-talk and supply noise. Second, the split in signal current between the two supplies makes it difficult to keep the return current physically adjacent to the signal current through the channel, which leads to poor termination and reflections.

In the single-ended signaling system 200, the current drawn from the power supply is data dependent. When transmitting a "0", the transmitter sinks current Is. Half of the current flows from the power supply into the receiving device 202, through the terminator, back over the signal wire, then through the current source in the transmitting device 201 to ground, and thence back to the power supply. The other half of the current flows from the power supply into the Vdd network of the transmitting device 201, through the terminator of the transmitting device 201, then through the current source, and back through the ground network.

When transmitting a "1", the steady state is one in which no current flows through the power supply network at all. Therefore, when data is toggling between "1" and "0", the peak-to-peak current in the Vdd and ground network of the transmitting device 201 is 2× the signaling current, and 1× in the receiving device 202; the varying current creates voltage noise on the internal power supplies of each of the transmitting device 201 and the receiving device 202 by dropping across the supply impedances. When all of the data pins that share a common set of Vdd/ground terminals are switching, the noise in the shared impedances is additive, and the magnitude of the noise comes directly out of the signaling noise budget. It is difficult and expensive to combat this noise: reducing the supply impedances generally requires providing more power and ground pins and/or adding more metal resources on chip to reduce impedances. Improving on-chip bypass costs in terms of area, e.g., for large thin-oxide capacitors.

A solution to address all three of the reference voltage, the return impedance, and the power supply noise problems is to employ differential signaling. The reference problem is non-existent when differential signaling is used. The return impedance problem is gone, thanks to the symmetric second signaling wire, which carries all of the return current. The power supply current is nearly constant and independent of the data being transmitted, However differential signaling requires twice as many signal pins as single-ended signaling, as well as the overhead of some number of power/ground pins.

Accordingly, what is needed in the art is a technique for providing single-ended signaling while reducing the problems of establishing a reference voltage, reducing the impedance of the signal return path, and reducing the power supply noise.

SUMMARY OF THE INVENTION

One embodiment of the present invention sets forth a technique for transmitting and receiving ground-referenced single-ended signals. A transmitter combines a direct current (DC) to DC converter, including a flying capacitor, with a 2:1 clocked multiplexer to drive a single-ended signaling line. The transmitter drives a pair of voltages that are symmetric about the ground power supply level. Signaling currents are returned directly to the ground plane or a plane at a different voltage level to minimize the generation of noise in the supply impedance that is a source of crosstalk between different signaling lines.

Various embodiments of the invention comprise a transmitter circuit that includes a precharge with flying capacitor sub-circuit and a discharge and multiplexor sub-circuit. The precharge with flying capacitor sub-circuit includes a first flying capacitor configured to be precharged to a supply voltage during a positive phase of a clock and a second flying capacitor configured to be precharged to the supply voltage during a negative phase of the clock. The discharge and multiplexor sub-circuit is configured to couple the first flying capacitor to a single-ended signaling line during the negative phase of the clock to drive the signaling line and is configured to couple the second flying capacitor to the single-ended signaling line during the positive phase of the clock to drive the signaling line.

Various methods of the invention for ground-referenced single-ended signaling include precharging a first flying capacitor to a supply voltage during a positive phase of a clock, discharging a second flying capacitor and driving a single-ended signal line during the positive phase of the clock, precharging a second flying capacitor to the supply voltage during a negative phase of the clock, and discharging the first flying capacitor and driving the single-ended signal line during the negative phase of the clock Advantages of the disclosed mechanism are the establishment of a supply voltage as a reference voltage, reduction of the impedance of the signal current return path, and reduction of noise introduced through the power supplies,

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

A single-ended signaling system may be constructed that uses one of the power supply networks as both the common signal return conductor and the common reference voltage. While either power supply, or even a network at a voltage level that is not used as a power supply, can be made to function as the common signal return conductor and the common reference voltage, the ground terminal is preferred, as explained further herein. Therefore, although ground-referenced signaling is described in the following paragraphs and illustrated in the Figures, the same techniques also apply to a signaling system referred to the positive supply network (Vdd), or some newly introduced common terminal.

Figure 3A:
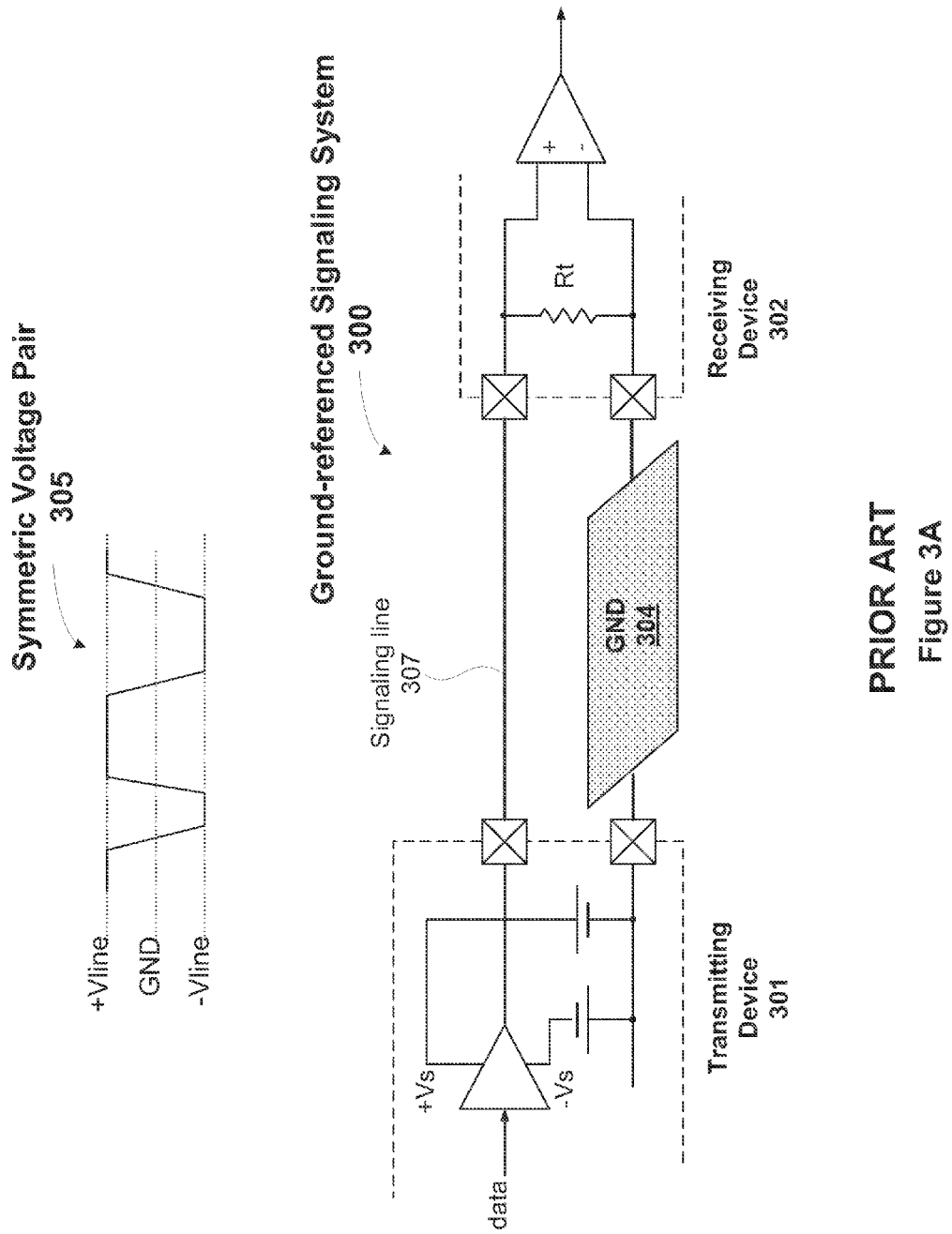
FIG. 3A illustrates a ground-referenced single-ended signaling system, according to the prior art.

FIG. 3A illustrates a ground-referenced single-ended signaling system 300, according to the prior art. For the ground-referenced single-ended signaling system 300 to function properly, the transmitting device 301 must drive a pair of voltages ±Vline that are symmetric about ground, shown as the symmetric voltage pair 305. A switch-capacitor DC-DC converter is used to generate the two signal voltages +/−Vs, and a conventional transmitter then drives ±Vline into the signaling line 307. +/−Vs are generated from the "real" power supply to the device, assumed to be a much higher voltage. For example, the supply voltage to the device may be about 1 volt, whereas the +/−Vs voltages may be about +/−200 mV.

In the ground-referenced signaling system 300, the ground (GND) plane 304 is the one and only reference plane to which signaling conductors are referred. At the receiving device 302, the termination resistor Rt is returned to a shared connection to the GND plane, so signaling currents cannot flow back to the transmitting device 301 on any other conductor, thereby avoiding the problem of current splitting previously described in conjunction with FIGS. 2A and 2B.

Referring back to FIG. 3A, the line voltage magnitude |Vline| is usually less than the signaling supply voltage |Vs|. For example, if the transmitting device 301 uses a self-source terminated voltage-mode transmitter, the transmitter consists (conceptually) of a pair of data-driven switches in series with a termination resistor. When the transmitter is impedance-matched to the signaling line 307, then |Vline|=0.5|Vs|.

The GND plane 304 and network (not shown) also defines the signal reference voltage. Advantageously, the GND network is generally the lowest impedance and most robust network in a system, particularly one with multiple power supplies. Therefore, differences in voltage between various points in the GND network are as small as possible within cost constraints. Consequently, reference noise is reduced to the smallest possible amplitude. Since the reference voltage is a supply terminal (GND), and is not generated internally or externally, there is no matching issue between signal and reference voltage to solve. In short, choosing GND 304 as the reference voltage avoids most of the problems outlined in conjunction with FIGS. 2A, 2B, and 2C.

The GND network is also a good choice for the common signal return conductor (or network) and the common reference voltage because it avoids the power supply sequencing problem that occurs when the two communicating devices are powered from different positive power supplies.

Conceptually, the reference voltage and signal return path problems are solved at the expense of introducing two new power supplies to generate the ±Vs voltages (within the transmitting device 301) required for symmetric signaling on the signaling line 307. The main engineering challenge, therefore, is how to generate the ±Vs voltages efficiently using the power supply voltage.

Assuming that an input offset voltage of the receiving device 302 can be cancelled, and that input referred thermal noise is on the order of 1 mV root-mean-square, about 50 mV of signal needs to be developed at the input to the receiving device 302 to overcome uncompensated offsets, cross-talk, limited gain, other bounded noise sources, and thermal noise (unbounded noise sources). Assuming the signaling line 307 will be equalized at the transmitter (as described further herein), on the order of ±Vs=±200 mV needs to be developed on the two signaling power supplies (+Vs and −Vs), assuming self-source termination.

Power supply voltages for CMOS are scaling relatively slowly, so for the next few generations of technology, the Vdd supply for core devices is anticipated to be in the range of 0.75 to 1 volt. The symmetric Vs voltages are therefore a small fraction of the power supply voltage. The most efficient regulators to convert a relatively high voltage to a low voltage are switched capacitor DC-DC converters.

Figure 3B:
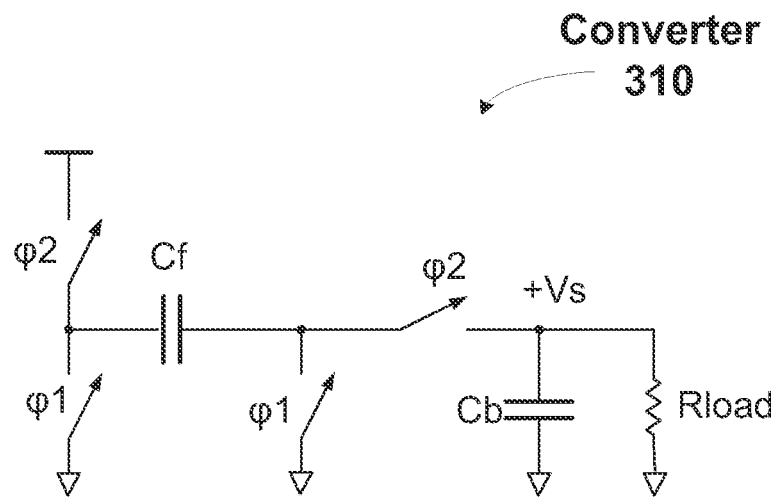
FIG. 3B illustrates a switched capacitor DC-DC converter configured to generate +Vs, according to the prior art.

FIG. 3B illustrates a switched capacitor DC-DC converter 310 configured to generate +Vs, according to the prior art. The switched capacitor DC-DC converter 310 is configured to generate +Vs from a much higher Vdd power supply voltage. The converter 310 generating the positive power supply, +Vs operates in two phases. During φ1, the "flying" capacitor Cf is discharged, and both terminals of Cf are driven to GND. A flying capacitor has two terminals and neither of the two terminals is coupled directly to a power supply, e.g., Vdd or GND. During φ2, Cf is charged to Vdd-Vs; the charging current flows through Cf and then into the load, Rload. A bypass/filter capacitor Cb, having a capacitance that is much larger than Cf, stores the supply voltage +Vs and provides current to the Rload during the φ1 intervals.

Figure 3C:
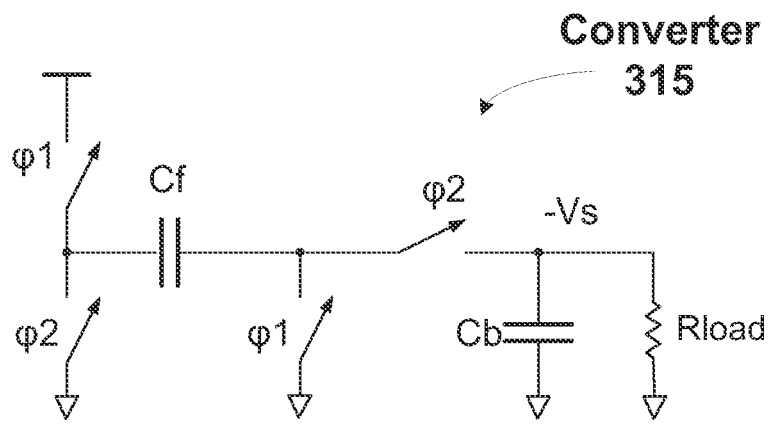
FIG. 3C illustrates a switched capacitor DC-DC converter configured to generate −Vs, according to the prior art.

FIG. 3C illustrates a switched capacitor DC-DC converter 315 configured to generate −Vs, according to one embodiment of the present disclosure. Like the switched capacitor DC-DC converter 310, the switched capacitor DC-DC converter 315 is configured to generate −Vs from a much higher Vdd. The switched capacitor DC-DC converter 315 that generates the negative supply −Vs is topologically identical to the switched capacitor DC-DC converter 310, but the charging switches are rearranged. During φ1, Cf is charged to Vdd. During φ2, Cf discharges into the load, Rload. Since the left hand terminal of Cf is more positive than the right hand terminal, the voltage on Rload is driven more negative on each cycle of operation.

The current supplied to the load by either the switched capacitor DC-DC converter 310 or 315 is proportional to the capacitance Cf, the frequency of the φ1/φ2 clock, and the difference between Vdd and Vs. When the two supplies, +Vs and −Vs are generated for the single-ended ground-referenced signaling system 300 using the switched capacitor DC-DC converters 310 and 315, the current drawn from each of the switched capacitor DC-DC converters 310 and 315 depends on the data to be transmitted. When data=1, current is supplied from +Vs to the signaling line 307 through the transmitting device 301, and the −Vs supply is unloaded. When data=0, current is supplied from the −Vs supply and the +Vs supply is unloaded.

Figure 1A:
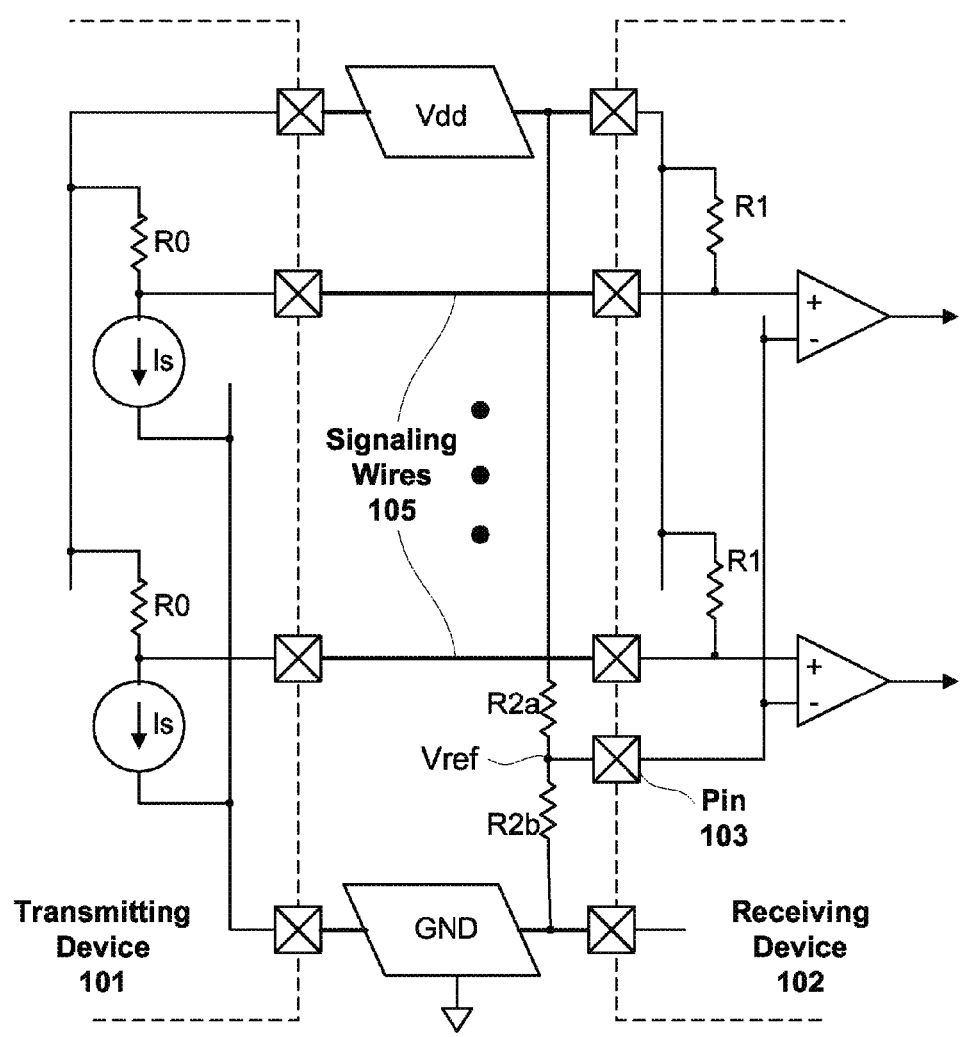
FIG. 1A shows an example single-ended signaling system, according to the prior art, that illustrates a reference voltage problem.
Figure 1B:
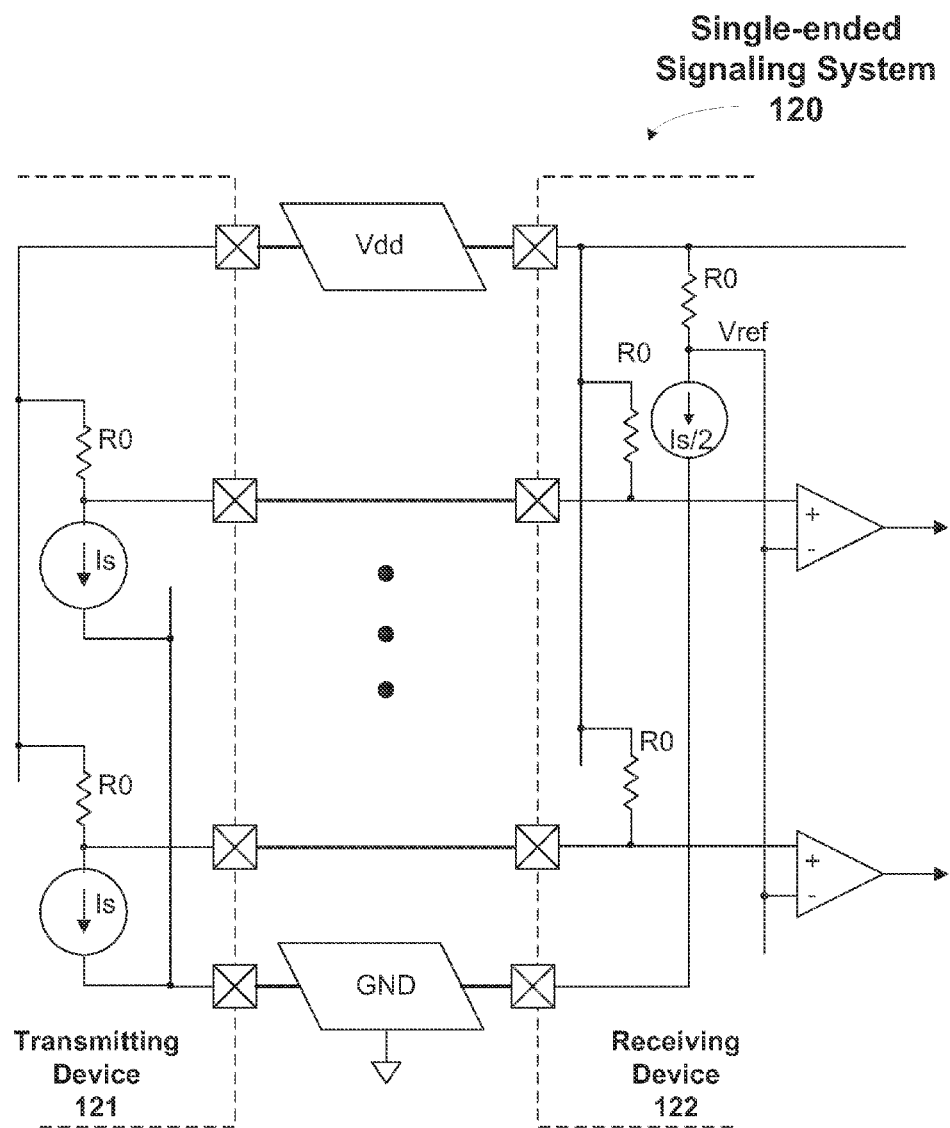
FIG. 1B shows an example single-ended signaling system, according to the prior art, that uses an internal reference voltage.
Figure 1C:
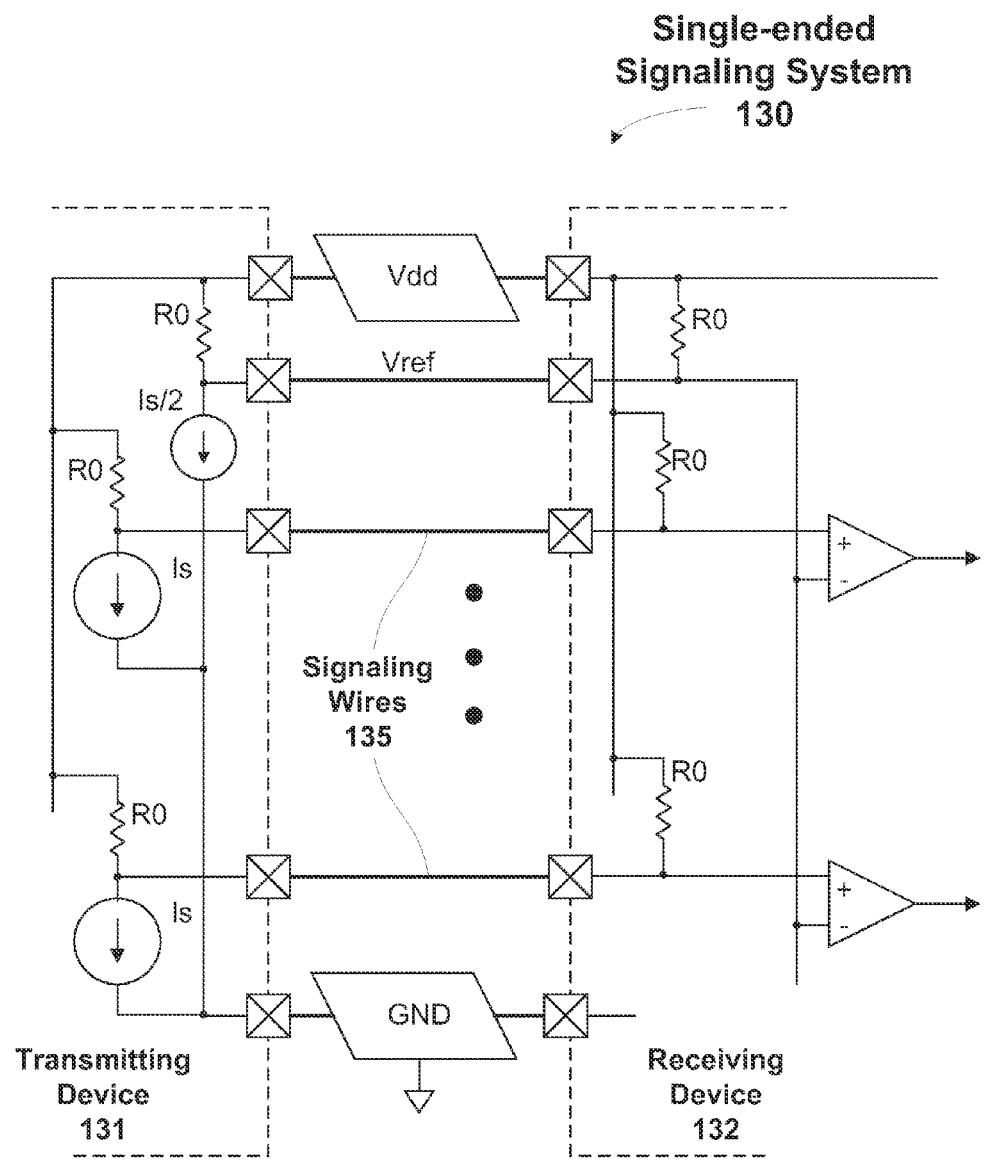
FIG. 1C shows an example single-ended signaling system, according to the prior art, that uses a bundled reference voltage.
Figure 2A:
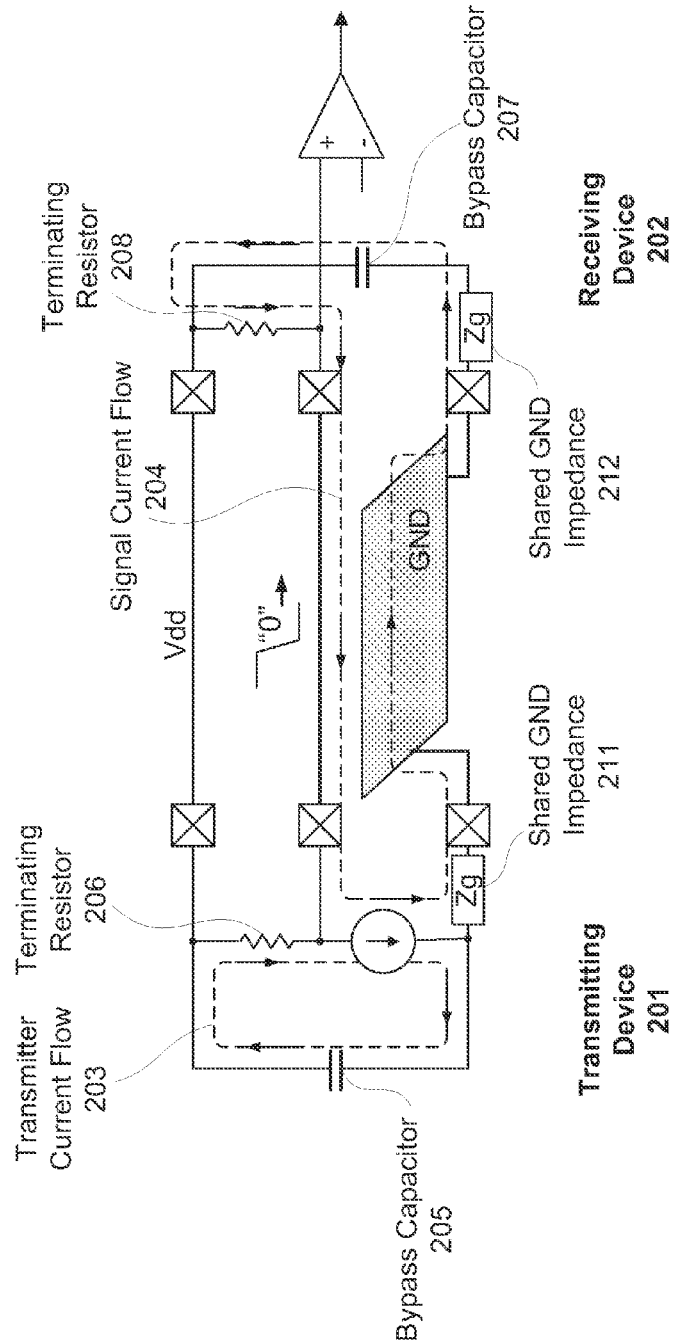
FIG. 2A shows the current flow in a single-ended signaling system, according to the prior art, in which the ground plane is intended to be the shared signal return conductor.
Figure 2B:
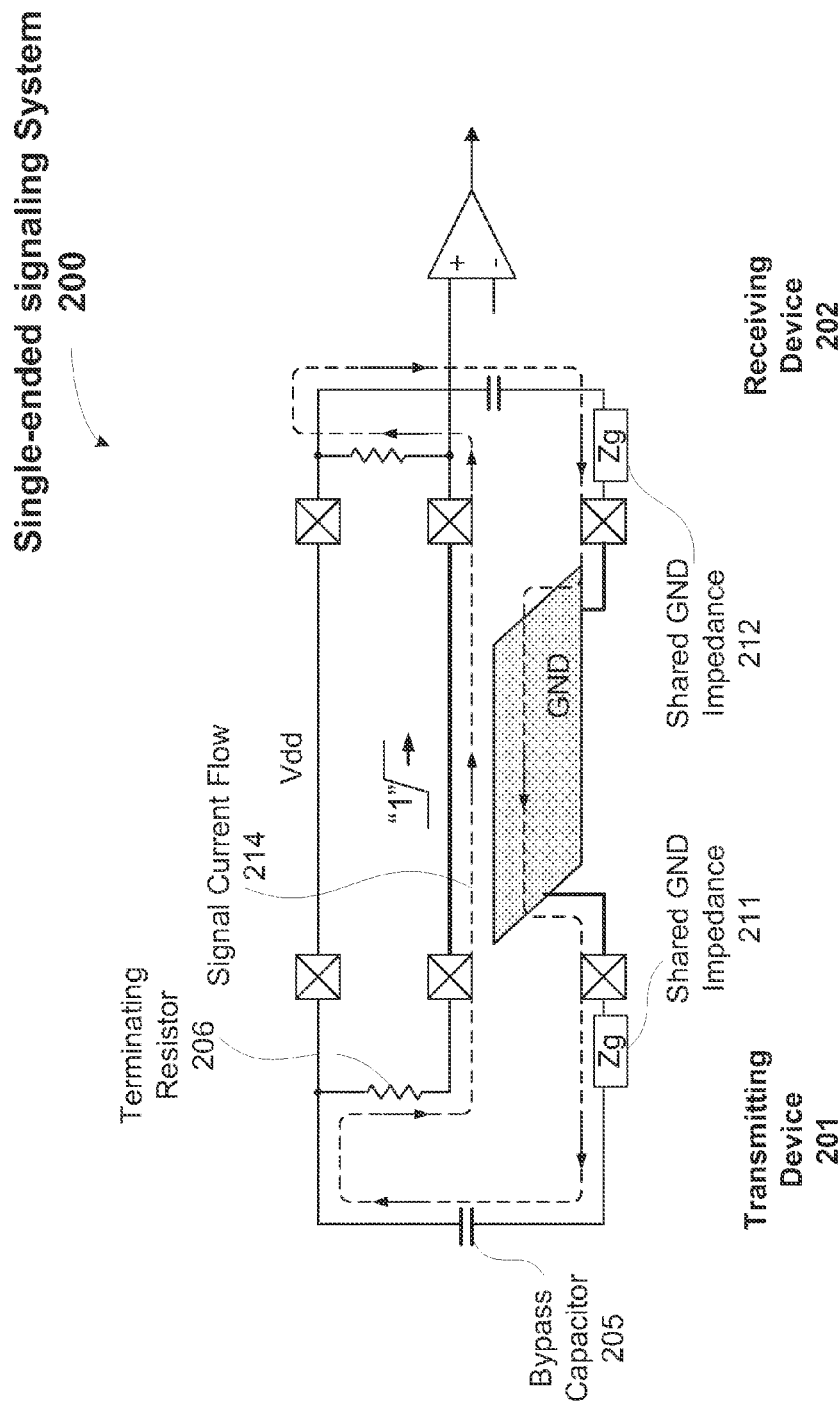
FIG. 2B shows the current flow in the single-ended signaling shown in FIG. 2A when a "1" is transmitted from the transmitting device to the receiving device, according to the prior art.

There are at least two significant features of the single-ended ground-referenced signaling system 300. First, if the two converters have the same efficiency, the current drawn from the Vdd supply is independent of data value, and this characteristic avoids the simultaneous switching problem inherent in most single-ended signaling schemes. In particular, the simultaneous switching problem described in conjunction with FIGS. 2A and 2B is avoided, Second, the two switched capacitor DC-DC converters 310 and 315 require a control system to hold the output voltages +Vs and −Vs, respectively, constant in the face of varying loads. Varying the value of the flying capacitor Cf, and Vdd and Vs is typically not practical, therefore the values of Cf, Vdd, and Vs are nominally fixed. However, the frequency of the switching clock is available as a control variable.

Figure 3D:
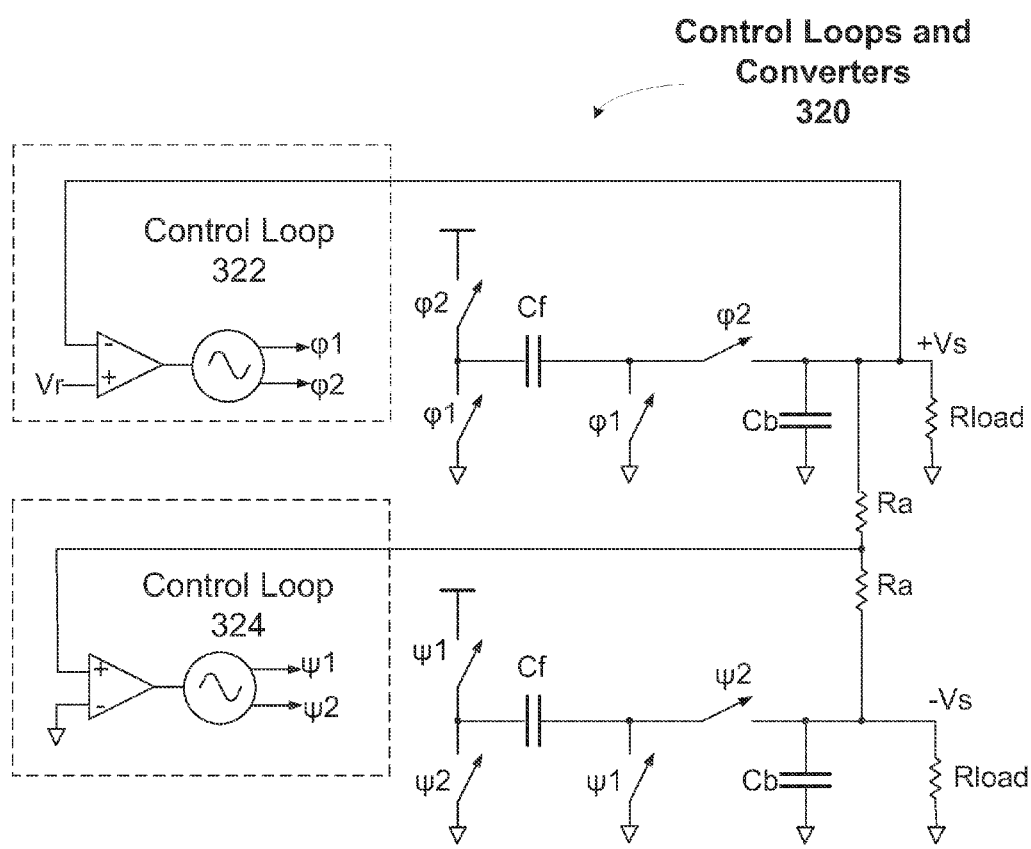
FIG. 3D illustrates a pair of abstract control loops for the two switched capacitor DC-DC converters of FIGS. 3B and 3C, according to the prior art.

FIG. 3D illustrates a pair of abstract control loops for the two switched capacitor DC-DC converters 310 and 315 of FIGS. 3B and 3C, respectively, according to one embodiment of the present disclosure. The control loop 322 compares +Vs with a power supply reference voltage Vr, and if V(Vs)<V(Vr) the frequency of φ1 and φ2 is increased to pump more current into the load. The control loop 324 operates by comparing a voltage midway between +Vs and −Vs with GND, thereby attempting to hold the two supply voltages +Vs and −Vs symmetric around GND.

While the control loops and converters 320 system could be built as shown in FIG. 3D, the two control loops 322 and 324 would likely be fairly complex, since the control loops 322 and 324 may need to handle a 100% variation in the load, Rload. Controlling ripple on +Vs and −Vs requires operating the switch capacitors Cf at high frequency and employing a large storage capacitor Cb. In practice the clocks φ1, φ2, ψ0 and ψ1 would likely have to output multiple phases, and drive a bank of multiple switch capacitors each operating on a different phase. In sum, such a solution requires significant complexity and consumes a large area in terms of circuitry on a silicon die.

The generation of a voltage level for the single-ended signal may be performed by combining a transmitter and the switched-capacitor DC-DC power supply into a single entity that also includes a 2:1 clock-controlled data multiplexer, thereby avoiding the complexity and large area of regulated switched capacitor converters. Instead of operating a switched-cap power supply at a frequency controlled by a control loop, the switched-capacitor converters are driven at the data clock rate. Data is driven onto the line by controlling the charge/discharge of flying capacitors according to the data value to be transmitted.

Figure 4A:
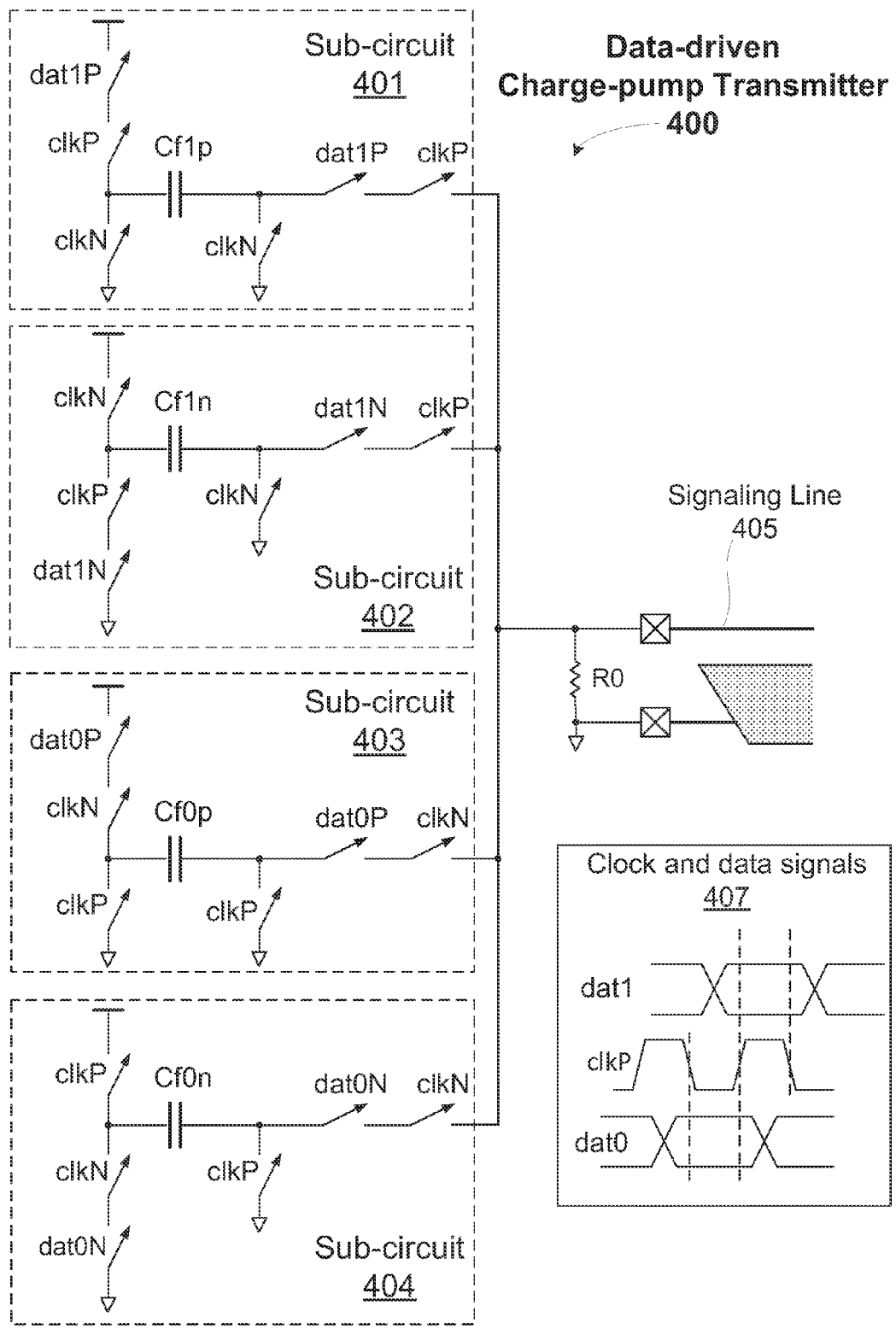
FIG. 4A illustrates a data-driven charge-pump transmitter, according to one embodiment of the present disclosure.

FIG. 4A illustrates a data-driven charge-pump transmitter 400, according to one embodiment of the present disclosure. The structure of the data-driven charge-pump transmitter 400 combines a clocked 2:1 data multiplexer with a charge-pump DC-DC converter. The data-driven charge-pump transmitter 400 multiplexes a half-rate di-bit data stream dat{1,0} into a single full-rate bit stream in such a way that dat1 is transmitted when clk=HI and dat0 is transmitted when clk=LO. The relationship between the clkP and data signals is shown in clock and data signals 407.

The upper half of the structure, including sub-circuits 401 and 402, is the dat1 half of the multiplexer, where dat1P=HI and dat1N=LO when dat1=HI. While clk=LO (clkP=LO and clkN=HI), Cf1p is discharged to the ground supply voltage and both terminals of Cf1p return to GND. While Cf1p is discharged, Cf1n is charged to the power supply voltage. In other words, during a negative phase of the clock (when clkN=HI) each capacitor Cf1p and Cf1n is precharged to a supply voltage by precharge and flying capacitor circuitry within the sub-circuit 401 and 402. Cf1p and Cf1n are discharged and charged to the power supply voltage, respectively.

During a positive phase of the elk, when clk goes HI (clkP=HI and clkN=LO), one of the two capacitors. Cf1p or Cf1n, dumps charge into the signaling line 405, depending on the value of dat1. For example, when dat1=HI, Cf1p is charged to Vdd-Vline, and the charging current drives the signaling line 405. The voltage level that the signaling line 405 is driven to depends on at least the value of Cf1p, Cf0p, Cf1n, and Cf0n, the value of Vdd, the impedance R0, and the frequency of the clock. In one embodiment of the present disclosure, values of Cf1p, Cf0p, Cf1n, Cf0n, Vdd, R0, and the clock frequency are fixed at design time to drive the signaling line 405 to a voltage level on the order of 100 mV. Cf1n is unchanged and remains charged. Therefore, Cf1n will consume no current on the next clk=LO phase. If, on the other hand, dat1=LO, then Cf1p remains discharged, and Cf1n discharges into the signaling line 405, driving the voltage on the signaling line 405 low to −Vline. During the positive phase of the clk, a 2:1 multiplexor operation is performed by multiplexor and discharge circuitry within sub-circuits 401 and 402 to select one of the two capacitors to drive the signaling line 405 to transmit dat1.

The lower half of the data-driven charge-pump transmitter 400 including sub-circuit 403 and 404 performs the same actions, but on the opposite phase of clk, and controlled by dat0.

Since there is no charge storage capacitor (other than the parasitic capacitance associated with the output, possibly including an electrostatic discharge protection device), there will likely be significant ripple in the voltage level of the signaling line 405. Importantly, the ripple in the voltage level will be at the bit-rate at which the data is driven onto the signaling line 405. If there is significant symbol-rate attenuation in the channel between the transmitting device and the receiving device, where the channel is comprised mainly of signaling line 405 and the ground plane associated with the signaling line 405, typically including package and printed-circuit board conductors, the ripple in the voltage level will be strongly attenuated. However, even if the ripple in the voltage level is not attenuated, the ripple primarily affects the amplitude of the signal at points in time when the data value on the signaling line 405 is changing that are away (in time) from the data value is optimally detected. Data dependent attenuation of the signaling line may be corrected using an equalizer, as described in conjunction with FIG. 4C.

Figure 4B:
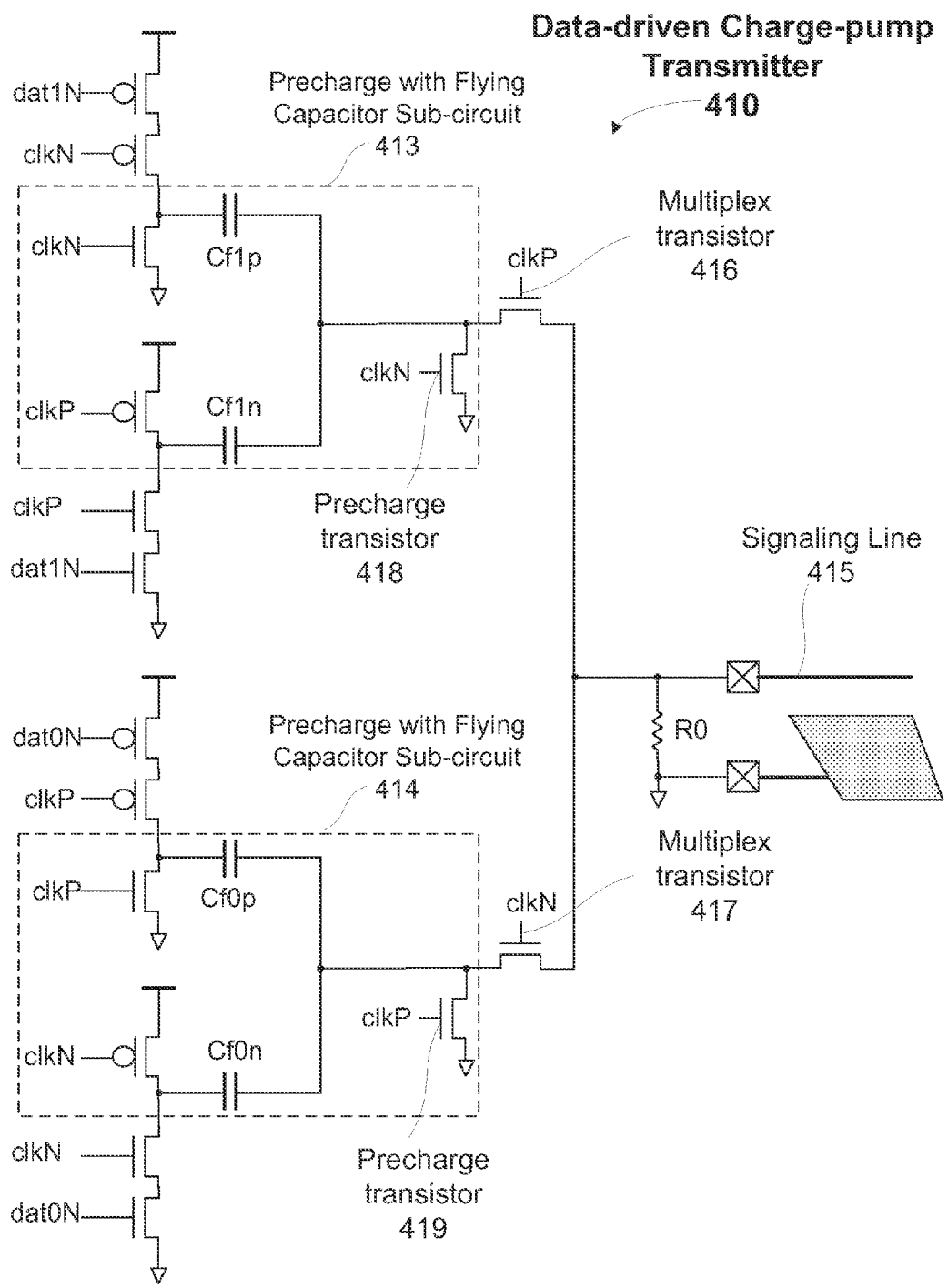
FIG. 4B illustrates a data-driven charge-pump transmitter implemented with CMOS transistors that is simplified compared with the data-driven charge-pump transmitter shown in FIG. 4A, according to one embodiment of the present disclosure.

There are a number of redundant elements in the data-driven charge-pump transmitter 400. FIG. 4B illustrates a data-driven charge-pump transmitter 410 implemented with CMOS transistors that is simplified compared with the data-driven charge-pump transmitter 400 shown in FIG. 4A, according to one embodiment of the present disclosure.

The precharge with flying capacitor sub-circuits 413 and 414 precharge the capacitors Cf1p and Cf1n during the negative phase of the clock and precharge capacitors Cf0p and Cf0n during the positive phase of the clock. The transistors that are not included within the precharge with flying capacitor sub-circuits 413 and 414 form the multiplexor and discharge sub-circuit that drives the signaling line 415 based on dat1 and dat0.

Because the output signal is driven to voltages below the lowest supply voltage (ground), some of the devices in the data-driven charge-pump transmitter 410 are operated under unusual conditions. For example, when the signaling line 415 is driven to −Vs, the output source/drain terminals of multiplex transistors 416 and 417 are driven below ground, so that their associated N+/P junctions are forward biased. This condition will not present any great difficulty provided the signal swing is limited to a few 100 millivolts. In cases where forward biased junctions become a problem, the negatively driven NMOS transistors required for the data-driven charge-pump transmitter 410 may be implemented within an isolated P substrate within a deep NWell, provided such structures are available in the target fabrication process technology. The isolated P substrates can be biased to a voltage below ground using another charge pump, one which, however, does not need to supply large currents. Negatively biased P-substrates avoid forward conduction in device source/drain junctions.

There is an additional problem presented by negative-transitioning signals. Suppose the signaling line 415 is being driven to −Vs during clkP=1, when multiplex transistor 416 is enabled. The gates of both precharge transistor 418 and multiplex transistor 417 are driven to 0 volts (ground). However, one of the source/drain terminals of each of precharge transistor 418 and multiplex transistor 417 are now at a negative voltage, thus becoming the source terminals of the respective devices. Since the gate-to-source voltages are now positive, the precharge transistor 418 and multiplex transistor 417 are turned on and will tend to clamp the negative-going output signal by conducting current to ground and limiting the available negative swing. This conduction does not, however, become significant until the negative-going voltage approaches the threshold voltage of precharge transistor 418 and multiplex transistor 417, and in practice the clamp current is small provided −Vs falls no more than 100 mV or so below ground. In processes that provide multiple threshold voltages, it may be advantageous to use high-threshold-voltage transistors to implement elements of any of the data-driven charge-pump transmitter 410 that may be driven to voltages below ground.

Figure 4C:
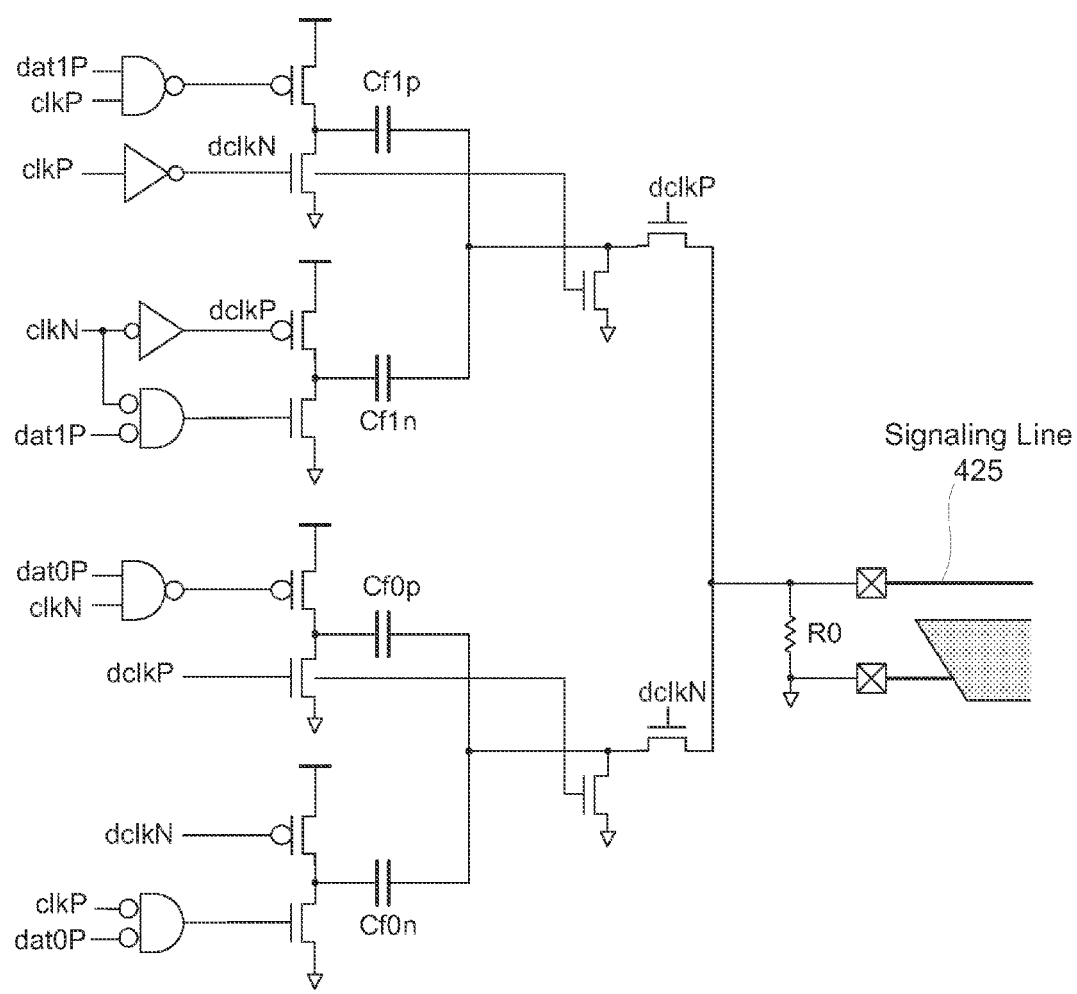
FIG. 4C illustrates a data-driven charge-pump transmitter implemented with CMOS gates and transistors, according to one embodiment of the present disclosure.

FIG. 4C illustrates a data-driven charge-pump transmitter 420 implemented with CMOS gates and transistors, according to one embodiment of the present disclosure. The data-driven charge-pump transmitter 420 avoids the need for series devices in the data multiplexing portion of the charge-pump transmitter. The NOR gates that pre-compute !clkN•!dat1P and !clkP•!dat0P may in practice be replaced by NANDs and inverters, since series PFETs are slow in most modern processes. The extra delay through the inverter can be balanced to some degree with sizing of the transistors.

The capacitors Cf1p and Cf1n are precharged during the negative phase of the clock and capacitors Cf0p and Cf0n are precharged during the positive phase of the clock. A 2:1 multiplexor and discharge sub-circuit drives the signaling line 425 based on dat1 during the positive phase of the clock and dat0 during the negative phase of the clock.

If there is strong frequency-dependent attenuation in the channel, the data-driven charge-pump transmitters 410 and 420 shown in FIGS. 4B and 4C, respectively, may require an equalizer.

Figure 4D:
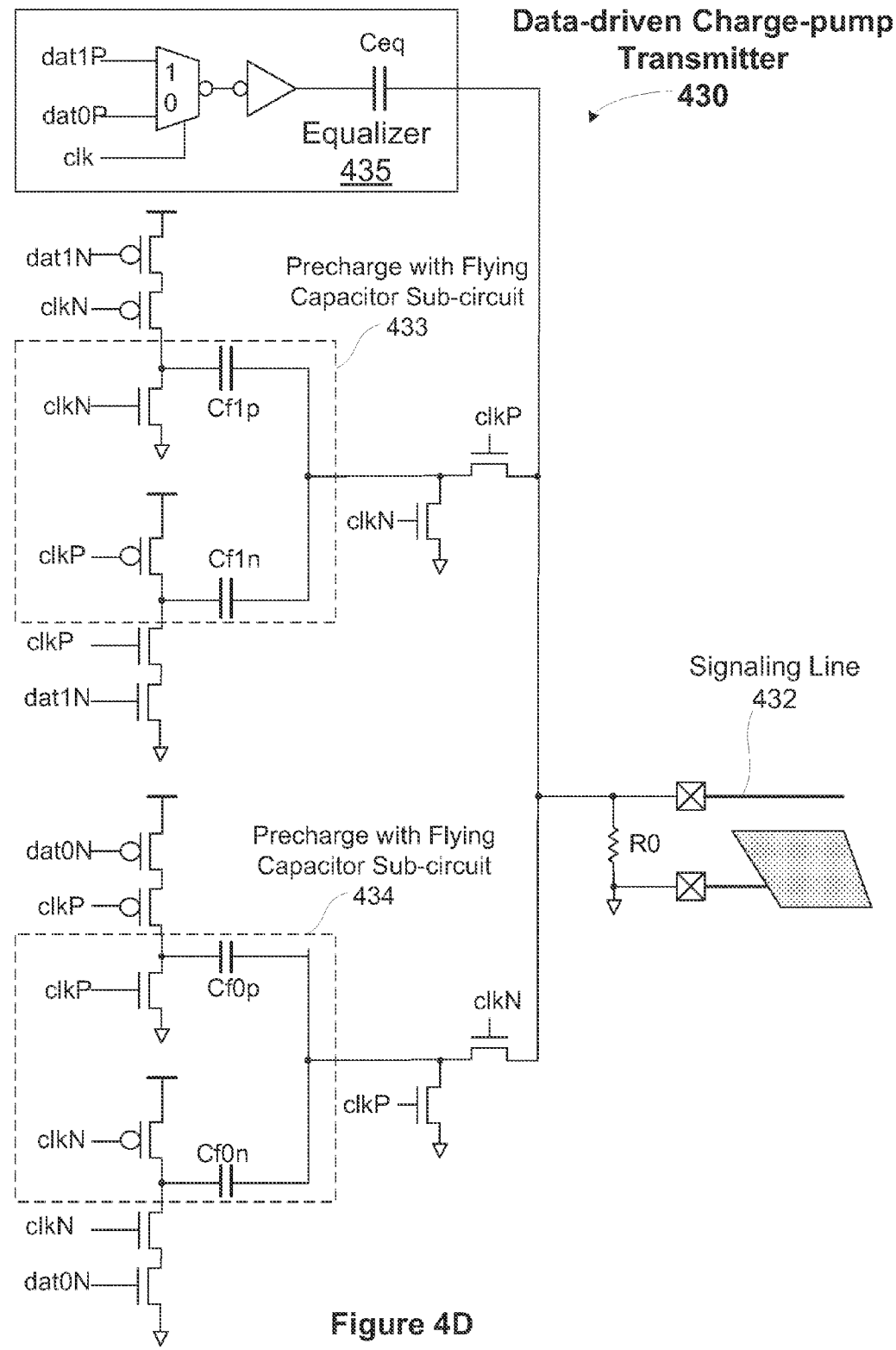
FIG. 4D illustrates a data-driven charge-pump transmitter that includes an equalizer, according to one embodiment of the present disclosure.

FIG. 4D illustrates a data-driven charge-pump transmitter 430 that includes an equalizer, according to one embodiment of the present disclosure. The precharge with flying capacitor sub-circuits 433 and 434 precharge the capacitors Cf1p and Cf1n during the negative phase of the clock and precharge capacitors Cf0p and Cf0n during the positive phase of the clock, respectively. The transistors that are not included within the precharge with flying capacitor sub-circuits 413 and 414 or the equalizer 435 form a multiplexor and discharge sub-circuit that drives the signaling line 432 based on dat1 during the positive phase of the clock and data during the negative phase of the clock. The circuits for precharging the flying the capacitors and multiplexing di-bit data onto the signaling line operate exactly the same as transmitter 410 in FIG. 4B.

A capacitively coupled pulse-mode transmitter equalizer 435, is wired in parallel with the data-driven charge-pump transmitter 430. When the output data changes value, the equalizer 435 pushes or pulls additional current to/from the signaling line 432, boosting the voltage of the signaling line 432 during the transition. The equalization constant can be varied by changing the ratio of Ceq to Cf. The equalizer 435 may be divided into a set of segments, each of which would have an "enable". By turning on some fraction of the segments, Ceq can be effectively varied, thereby varying the equalization constant. The data-driven charge-pump transmitter 430 circuit may be laid out as an array of identical segments, and adding enables to each segment allows for adjusting the voltage of the signaling line 432 in accordance with operating requirements.

Figure 4E:
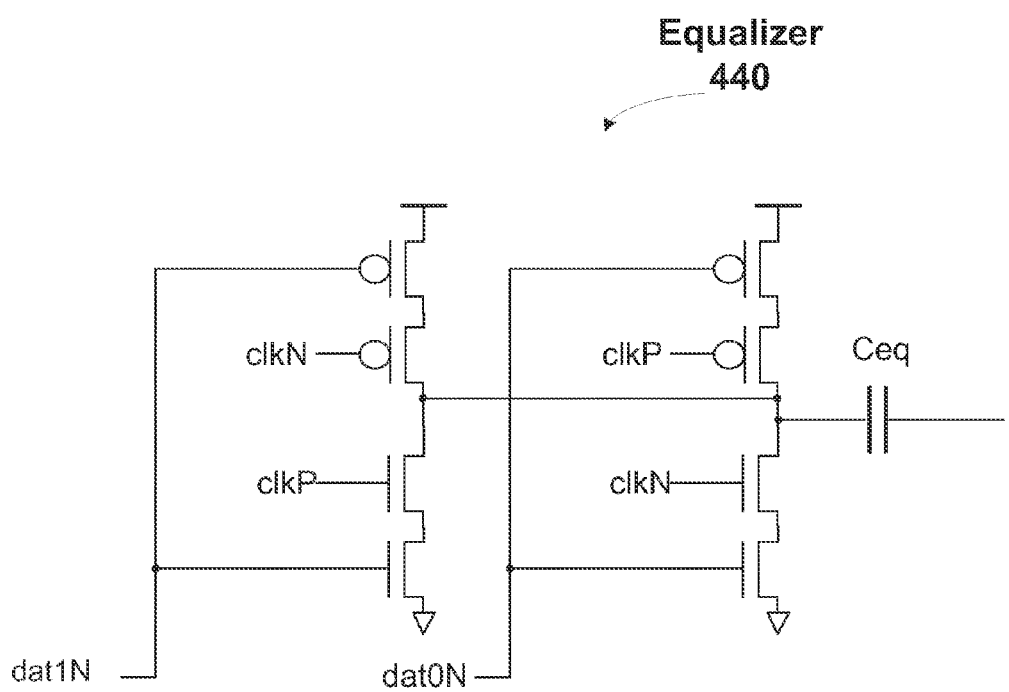
FIG. 4E illustrates an equalizer that boosts the signal line voltage without an additional gate delay, according to one embodiment of the present disclosure.
Figure 4F:
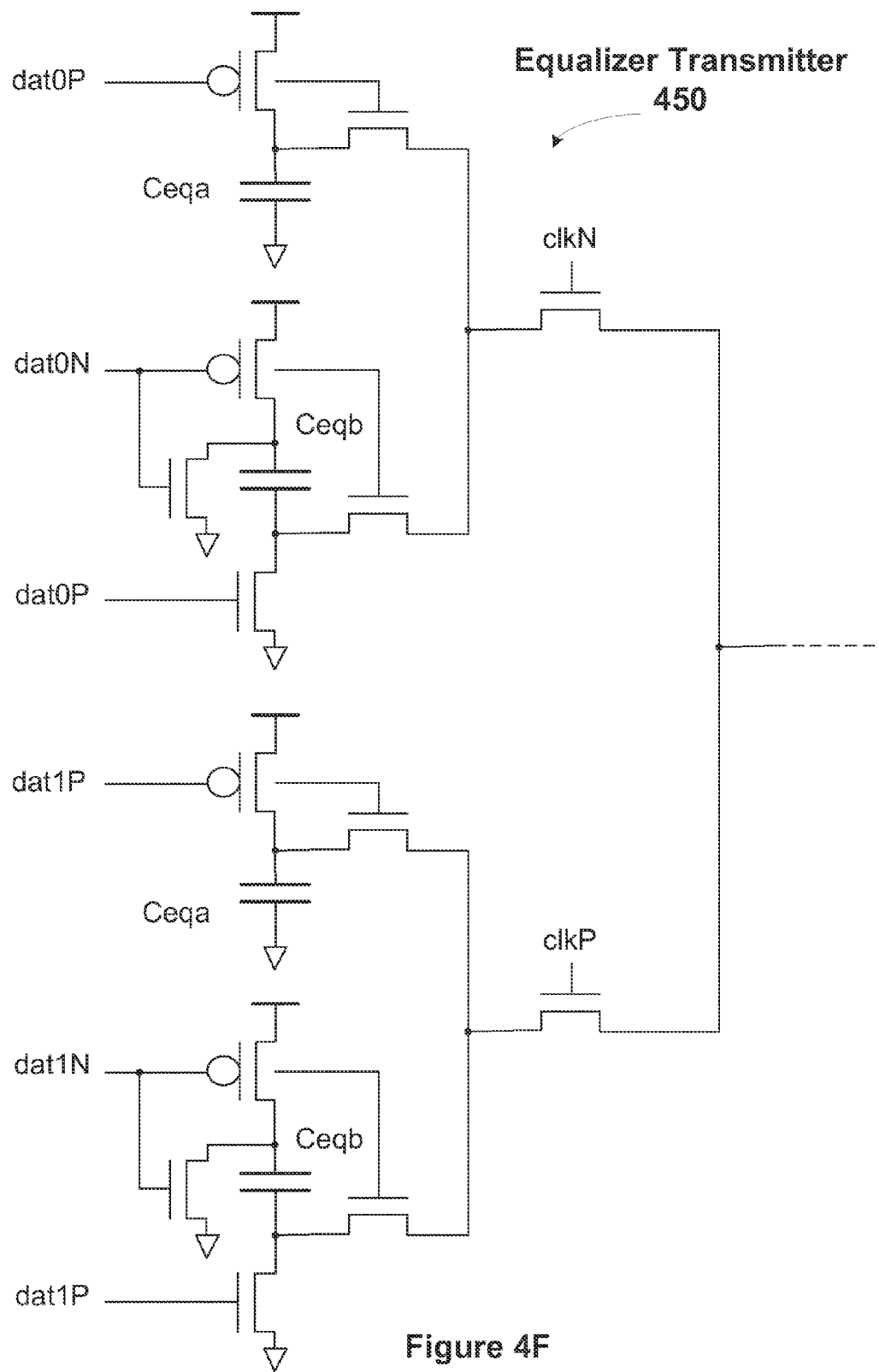
FIG. 4F illustrates yet another equalizer that uses flying capacitors manipulated by the data bits rather than the clock to drive additional current into the signaling line on data transitions.

Note that the equalization scheme shown in FIG. 4D has a problem that the equalizer 435 has an additional gate delay (the inverter) after the multiplexing function, so the boost in voltage produced by the equalizer 435 will be slightly delayed relative to the transition driven out of the data-driven charge-pump transmitter 430. If needed, the clocks that drive the data-driven charge-pump transmitter 430 may be delayed by one inverter delay, or the equalizer 435 may be implemented in a style identical to the data-driven charge-pump transmitter 430. FIG. 4E illustrates an equalizer 440 that boosts the signal line voltage without an additional gate delay, according to one embodiment of the present disclosure. FIG. 4F illustrates yet another equalizer that uses flying capacitors manipulated by the data bits dat{1,0} rather than the clock to drive additional current into the signaling line on data transitions.

The data-driven charge-pump transmitters 410, 420, and 430 shown in FIGS. 4B, 4O, and 4D do not address the problem of return current flow in the transmitter. Avoiding the return-current split that is problematic in conventional single-ended signaling systems is desired. However, when the signaling line is driven positive in the data-driven charge-pump transmitters 410, 420, and 430, current flows into the signaling line from the power supply, so that the return current must flow through the power supply at the transmitter.

The flow of current into the signaling line from the power supply may be mitigated fairly effectively by providing a bypass capacitor between the supply and the signal ground, so that most of the signaling current is drawn from the bypass capacitor, allowing the return current to flow locally to the transmitter, Adding a small series resistance between the power supply and the positive supply terminal of the transmitter will further enhance the effect of forcing the return current to flow locally to the transmitter. The small series resistance, together with the bypass capacitor isolates the supply from the ripple current required to charge the flying capacitors, and also isolates the high-frequency part of the signal return current.

Figure 5A:
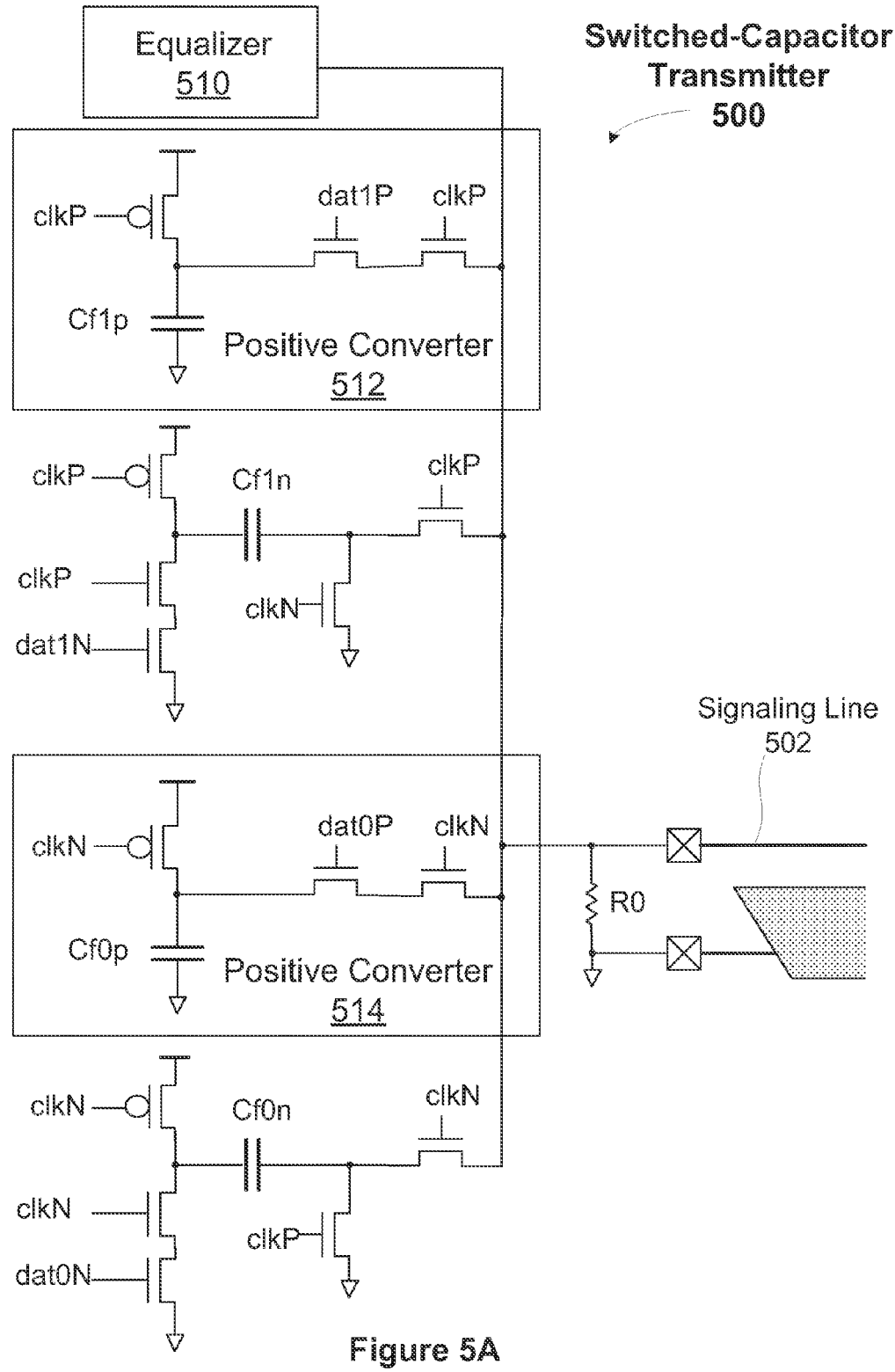
FIG. 5A illustrates a switched-capacitor transmitter that directs return current into the ground network, according to one embodiment of the present disclosure.

FIG. 5A illustrates a switched-capacitor transmitter 500 that directs return current into the ground network, according to one embodiment of the present disclosure. The positive-current converter portions of the switched-capacitor transmitter 500, positive converters 512 and 514, are modified compared with the data-driven charge-pump transmitters 410, 420, and 430 so that the current that flows into the signaling line 502 from the positive converters 512 and 514 flows only in the ground network. Cf1p and Cf0p are first precharged to the power supply voltage, and are then discharged into the signaling line 502. The negative converter portions of the switched-capacitor transmitter 500 remain the same compared with the data-driven charge-pump transmitters 410, 420, and 430, since the output currents of the negative converters flow only in the GND network. The switched-capacitor transmitter 500 includes an equalizer 510 that may be implemented using the circuit for equalizer 435 or 440.

Figure 5B:
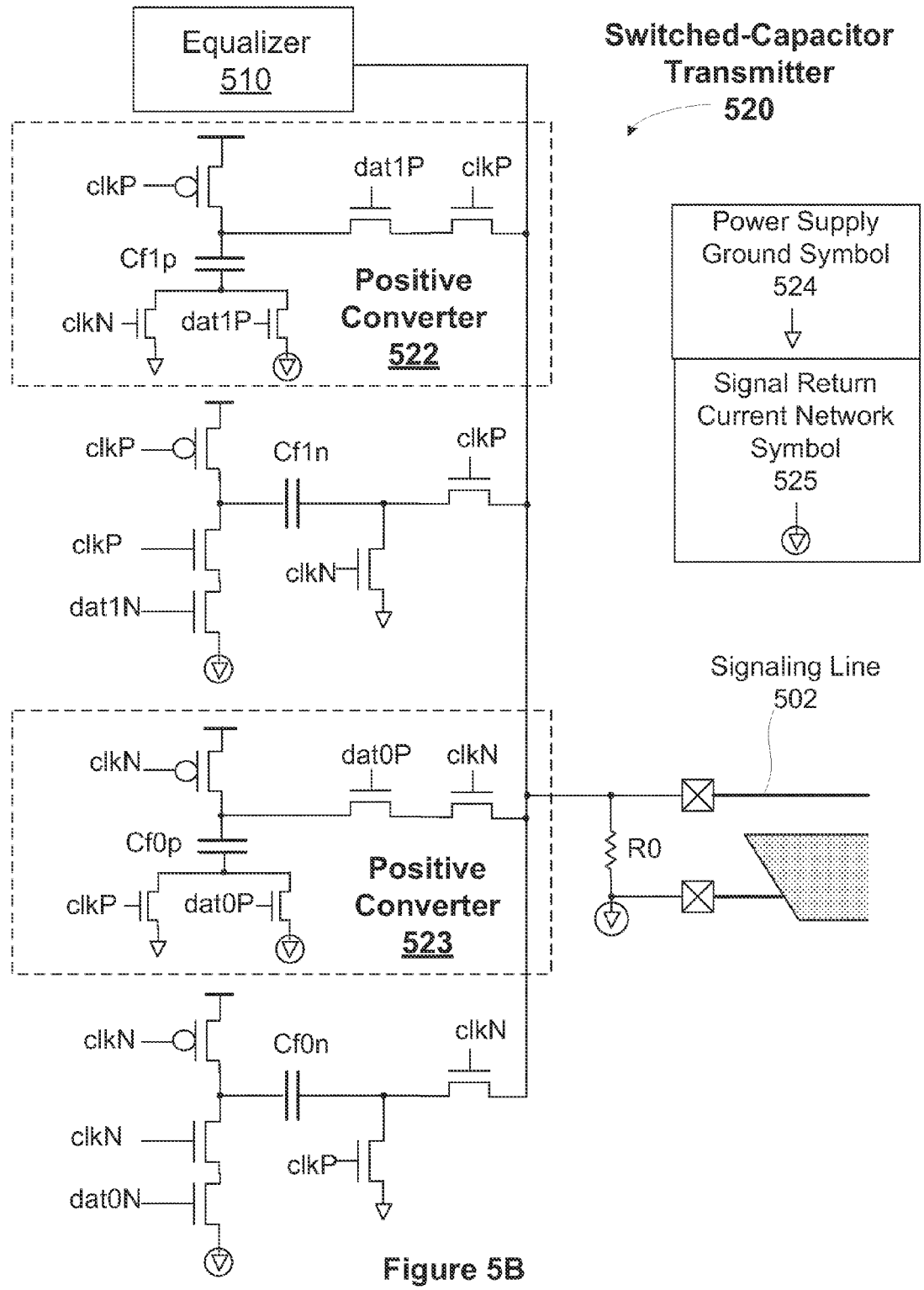
FIG. 5B illustrates an equalizer circuit that keeps the precharge current out of the GND network, according to one embodiment of the present disclosure.

By adding a few more switching transistors to the switched-capacitor transmitter 500, it is possible to separate the ground network into two parts: an internal network for pre-charging the flying capacitors and the external network that is part of the signaling system. FIG. 5B illustrates a switched-capacitor transmitter that implements separate ground return paths for precharging and signal currents. The circuit components for the negative-drive flying capacitors Cf0n and Cf1n remain the same as in FIG. 5A. The positive converters 522 and 523 have been modified with the addition of two transistors each. In positive converter 522 an NMOSfet driven by clkN carries precharge current to the internal power supply ground network, indicated by symbol 524. When data is driven out of this converter on dat1P=1, a second NMOSfet driven by dat1 P carries the signal return current to the signal current return network, indicated by symbol 525. This arrangement prevents the precharge currents in converters 522 and 523 from injecting noise into the signal current return network.

A practical problem that should be addressed is that capacitors are usually realized on-chip using thin oxide. In other words, the capacitors are MOS transistors, often varactors (NMOS caps). These capacitor structures have parasitic capacitances from their terminals to the substrate and to surrounding conductors, usually somewhat asymmetric. For example, a NMOS varactor has a gate with mostly beneficial overlap capacitances with the source and drain terminals of the NMOS varactor, but the NWell body, which is ohmically connected to the source and drain terminals, has capacitance to the P-substrate. In the case of flying capacitors, the parasitic capacitance (optimally placed on the signaling line side of the capacitor) will have to be charged and discharged on each cycle. The current that is charging the parasitic capacitance is not available for driving the signaling line. The parasitic capacitance, along with switch losses, reduces the efficiency of the switched-capacitor transmitter 500.

The Ceqa capacitors within the equalizer 510 of FIG. 5B, are grounded, so the converter circuitry using the Ceqa capacitors are likely to be more efficient than the converters using flying capacitors Ceqb. The better efficiency of the Ceqa capacitors relative to the Ceqb capacitors may be compensated for by different sizing of Ceqa and Ceqb.

Figure 5C:
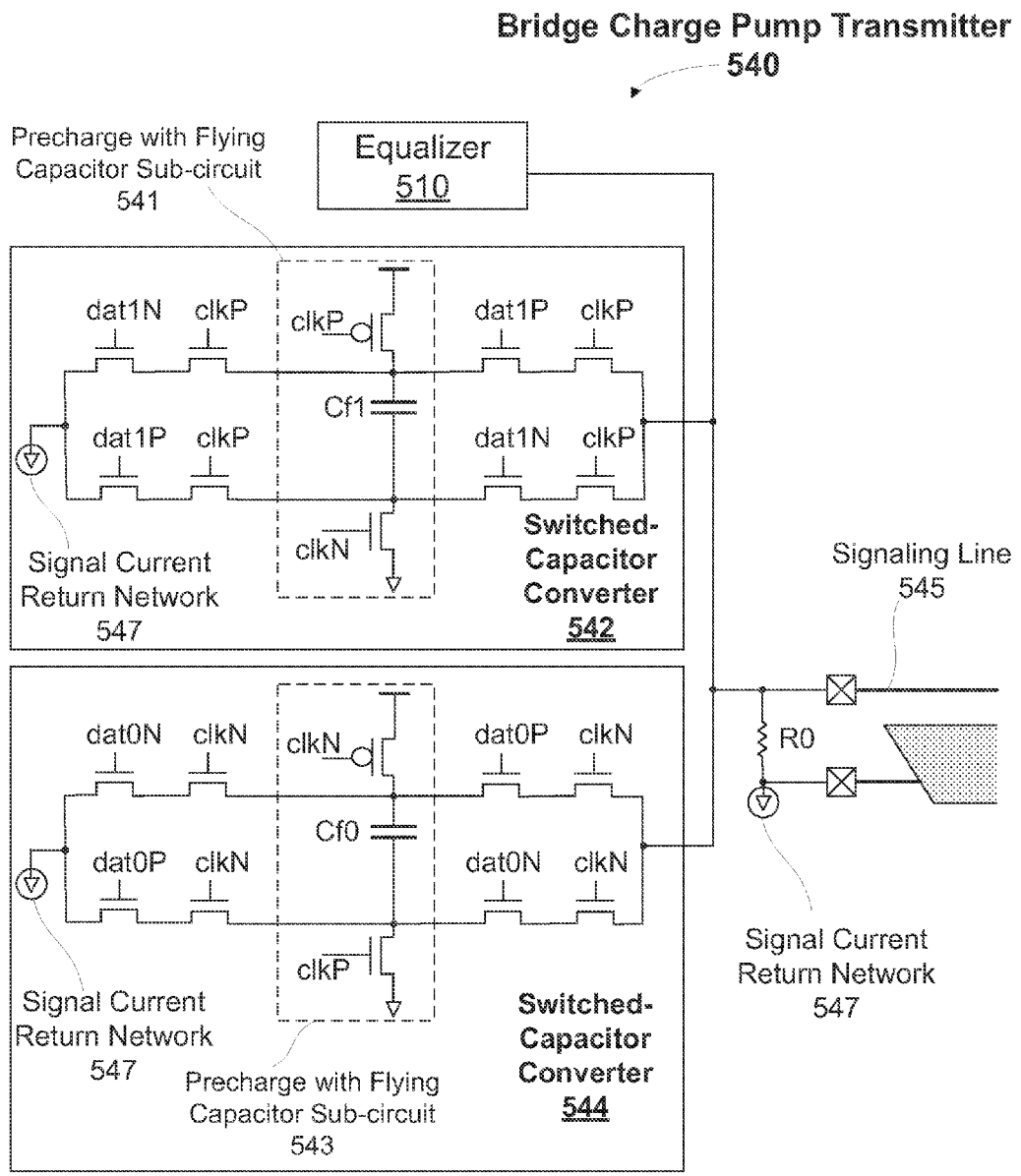
FIG. 5C illustrates a "bridge" charge pump transmitter in which the output current flows only in the GND network, according to one embodiment of the present disclosure.

FIG. 5C illustrates a "bridge" charge pump transmitter 540 in which the output current flows only in the signal current return network 547 while the precharge current flows only in the internal power supply ground network, according to one embodiment of the present disclosure. While the internal power supply ground network and the signal current return network 547 are separate networks for the purposes of noise isolation, they remain nominally at the same potential, since the part of the signal current return network outside the chip in the "channel" is shared with the power supply ground. In the "bridge" charge pump transmitter 540, a single flying capacitor Cf1 and Cf0 is used for each phase of the clock (clk, where clkN is inverted clkP). Referring to the switched-capacitor converter 542, the flying capacitor Cf1 within the precharge with flying capacitor sub-circuit 541 is pre-charged to the power supply voltage when clk=LO. On clk the flying capacitor Cf1 dumps the charge into the signaling line 545, pulling the signaling line 545 HI if dat1 =HI, and pulling the signaling line 545 LO if dat1=LO.

The switched-capacitor converter 544 performs the same operation on the opposite phase of the clock and is controlled by dat0. Specifically, the flying capacitor Cf0 within the precharge with flying capacitor sub-circuit 543 is pre-charged to the power supply voltage when clk=HI. On clk=LO the flying capacitor Cf0 dumps the charge into the signaling line 545, pulling the signaling line 545 HI if dat0=HI, and pulling the signaling line 545 LO if dat0=LO. The transistors within the switched-capacitor converters 542 and 544 that are not within the precharge with flying capacitor sub-circuits 541 and 543 form a 2:1 multiplexor and discharge sub-circuit.

In the "bridge" charge pump transmitter 540 the pre-charge current may be separated from the current in the signal current return network 547. For example, when the signal current return network 547 is isolated from the other ground supplies, the pre-charge current does not flow into the signal ground 547, and therefore creates no noise in the network coupled to the signal ground 547. Note that the four clocked NFETs in each of the "bridge" connections may be "logically" collapsed to 2 devices. However, while the flying capacitor Cf1 (or Cf0) is being pre-charged, the associated data bit is toggling, and there is a good chance that both datP- and datN-driven NFETs may be turned on at the same time during the commutation, drawing current away from the pre-charge. Therefore, in practice, the four clocked NFETS should not be collapsed.

Figure 5D:
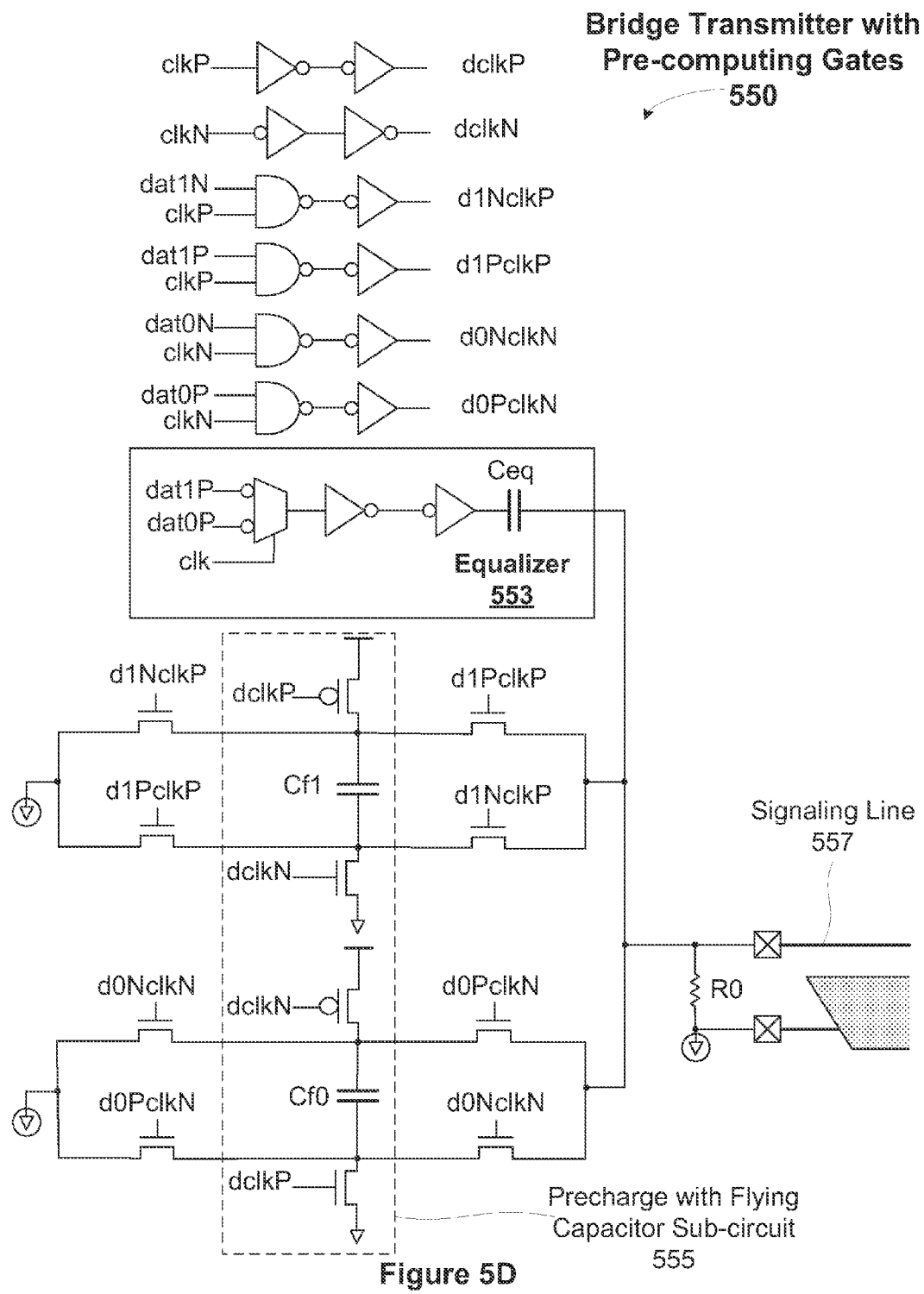
FIG. 5D illustrates a bridge transmitter with pre-computing gates, according to one embodiment of the present disclosure.

To avoid having to size up the four NFETs that are in series in each of the signal current paths, devices in the "bridge" charge pump transmitter 540, pre-computing gates may be used. FIG. 5D illustrates a bridge transmitter with pre-computing gates 550, according to one embodiment of the present disclosure. The delay in the clock signals is balanced by gating the clock signals clkN and clkP with the data signals dat1N, dat1P, dat0P, and dat0N, The gating allows the delay of signals within the transmitter 550 to be closely matched to delays within the equalizer 553, since both involve the same number of logical stages. The delay through the multiplexer and first inverter in the equalizer 553 approximately matches the delay of the NAND gates and inverters associated with the NAND gates in the precomputing gates that generate d1NclkP, and so forth. Likewise, the delay through the inverter that directly drives equalizing capacitor Ceq can be made to match the delay through the two sets of four "bridge" transistors that drive output current into the signaling line 557.

Depending on fabrication process details, the bridge transmitter with pre-computing gates 550 may provide lower overall power, though at the expense of some additional power-supply noise induced jitter compared with the "bridge" charge pump transmitter 540 and the switched capacitor transmitter 500.

The circuitry of the bridge transmitter with pre-computing gates 550 may be laid out in significantly less area than the switched capacitor transmitter 500 because the flying capacitors within the precharge with flying capacitor sub-circuit 555 are utilized on every cycle, so there are only half as many flying capacitors compared with the switched capacitor transmitter 500 of FIG. 5A and the data-driven charge-pump transmitters 400, 410, 420, and 430 of FIGS. 4A, 4B, 4C, and 4D, respectively.

The bridge transmitter with pre-computing gates 550, the "bridge" charge pump transmitter 540, and the switched capacitor transmitter 500 each include a termination resistor R0 on the signaling line. If a transmitter is back terminated, the terminating resistor should be sized larger than the characteristic impedance of the signaling line, since the charge pumps are not ideal current sources. In some cases, back termination may not be necessary, and, if so the charge pumps need only supply ½ the current compared a signaling line that is terminated. The elimination of back termination is an opportunity to save significant power, A determination may be made regarding whether the required flying capacitors may be practically realized in a CMOS fabrication technology. Suppose ±100 mV should be delivered into a back terminated 50Ω transmission line. The charge pumps must each source 100 mV/25Ω=4 mA of current. Using I=CdV/dt, where dV=V(Vdd)−V(line) and dt=1 UI. the required capacitance may be calculated once the supply voltage and bit-rate of the data is known. Suppose V(Vdd) =0.9V and 1 UI=50 psec, then C=250 fF. A 250 fF capacitor is easily realizable in a CMOS fabrication process. The capacitance of an NMOS varactor in a typical 28 micron CMOS process is about 50 fF/µ2, so the flying capacitors will account for a few µ2 of area. In general, the flying capacitors will have to be sized larger than is needed for the required calculated value because of switching losses and parasitic capacitances.

The transmitters, bridge transmitter with pre-computing gates 550, the "bridge" charge pump transmitter 540, and the switched capacitor transmitter 500 drive the voltage of the signaling line to a fixed fraction of the power supply voltage, where the fraction depends on the frequency of operation (bit-rate of the data) and the sizing of the flying capacitors. Power supply voltage is usually specified to vary by ±10%, so a direct implementation of the bridge transmitter with pre-computing gates 550, the "bridge" charge pump transmitter 540, and the switched capacitor transmitter 500 will leave the signal voltage varying by a similar fraction.

Figure 5E:
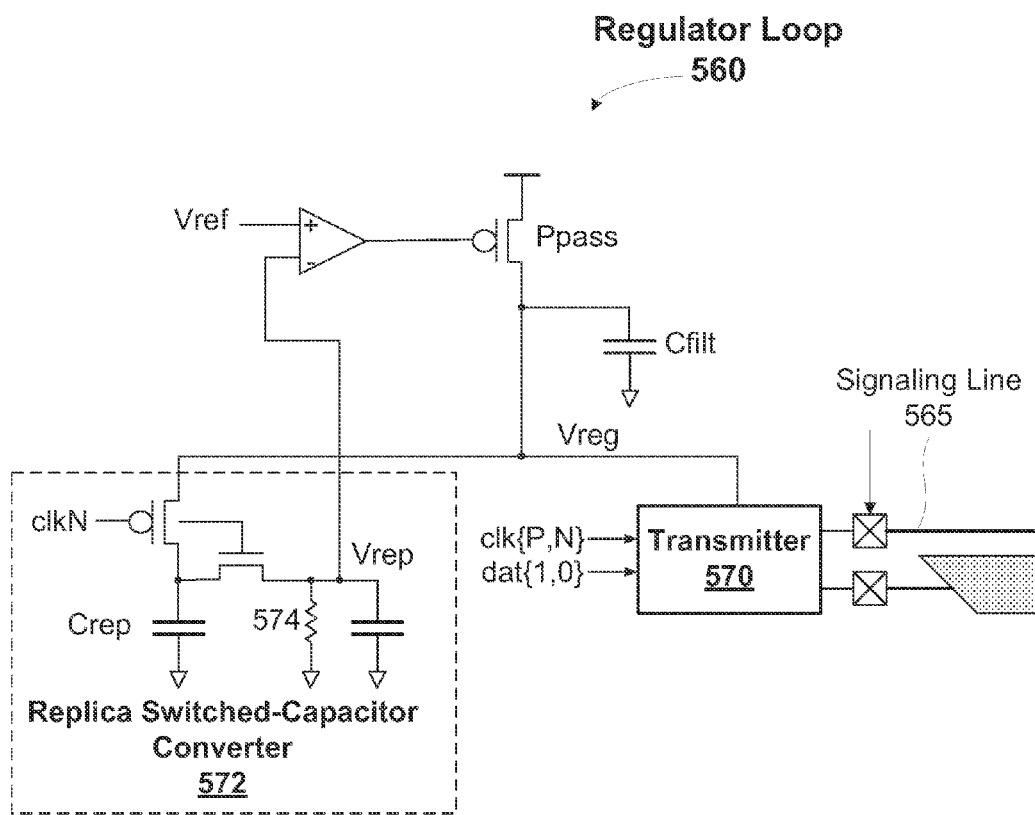
FIG. 5E illustrates a regulator loop for controlling the voltage on the signaling line, according to one embodiment of the present disclosure.

If it is necessary to hold the voltage swing of the signaling line to a tighter tolerance than the power supply variation, the transmitters (and the equalizer) may be enclosed in a control loop. FIG. 5E illustrates a regulator loop 560 for controlling the voltage on the signaling line 565, according to one embodiment of the present disclosure. In the regulator loop 560 the switched-capacitor transmitter 570 and an equalizer (not shown) operate not from Vdd, but from a regulated voltage Vreg, nominally set lower than the lowest expected voltage on the chip power supply Vdd. The main regulating element is a pass transistor Ppass that charges a large filter capacitor Cfilt. The pass transistor is driven by a comparator that compares a reference voltage Vref, set to the desired line voltage, and Vrep, the output of a replica switched-capacitor converter 572.

The replica switched-capacitor converter 572 is a copy, perhaps scaled, of one of the data-driven switched-capacitor converters in the transmitter 570. The replica switched-capacitor converter 572 cycles on every elk (either polarity of clk can be used), driving a (perhaps scaled) resistor 574 having a resistance that equals either the impedance of the signaling line 565 (in the case where the transmitter 570 has no back termination), or half the impedance of the signaling line 565 (in the case where the transmitter 570 has back termination). The load of the replica switched-capacitor converter 572 includes a large capacitor Crep to remove ripple from the Vrep output. Regulators such as regulator loop 560 are usually designed so that the output filter (Cfilt) establishes the dominant pole in the closed-loop transfer function. Additional elements (not shown) may be included in the circuit to stabilize the loop.

Figure 5F:
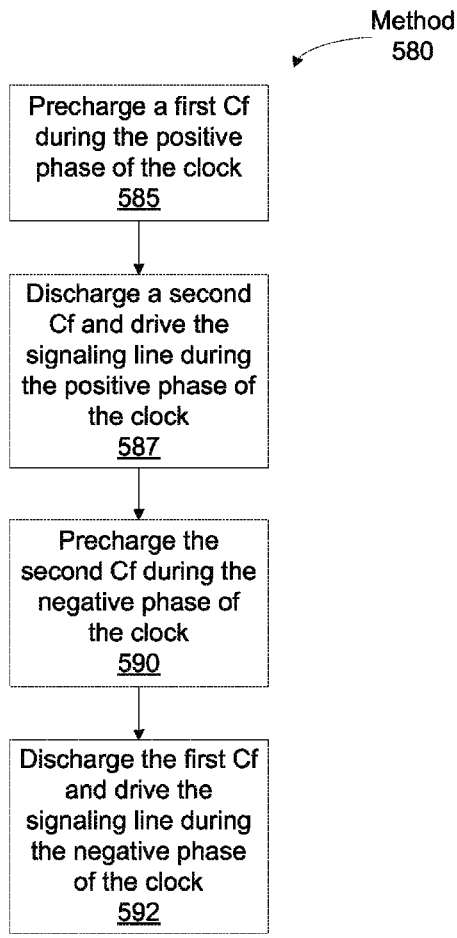
FIG. 5F illustrates a method for precharging a flying capacitor sub-circuit and driving the signaling line on different phases of the clock, according to one example embodiment of the present disclosure.

FIG. 5F illustrates a method for precharging a flying capacitor sub-circuit and driving the signaling line on different phases of the clock, according to one example embodiment of the present disclosure. Although the method steps are described in conjunction with the data-driven charge-pump transmitters 400, 410, 420, and 430 of FIGS. 4A, 4B, 4C, and 4D, the switched-capacitor transmitter 500 of FIG. 5A, the bridge charge pump transmitter 540 of FIG. 50, and the bridge transmitter with pre-computing gates 550 of FIG. 5D, persons of ordinary skill in the art will understand that any system configured to perform the method steps, in any order, is within the scope of the disclosure.

The two different clock phases include a positive phase when clkP is HI and a negative phase when clkN is HI. The data is split into two signals, dat0 and dat1 where dat0 is valid when clkN is HI and dat0 is valid when clkP is HI. At step 585 a first flying capacitor Cf is precharged by a precharge with flying capacitor sub-circuit during the positive phase of the clock. At step 587 a second flying capacitor Cf is discharged and the signaling line is driven (HI or LO) by a multiplexor discharge sub-circuit during the positive phase of the clock. At step 590 the second flying capacitor Cf is precharged by the precharge with flying capacitor sub-circuit during the negative phase of the clock. At step 592 the first flying capacitor Cf is discharged and the signaling line is driven (HI or LO) by the multiplexor discharge sub-circuit during the positive phase of the clock.

Figure 6A:
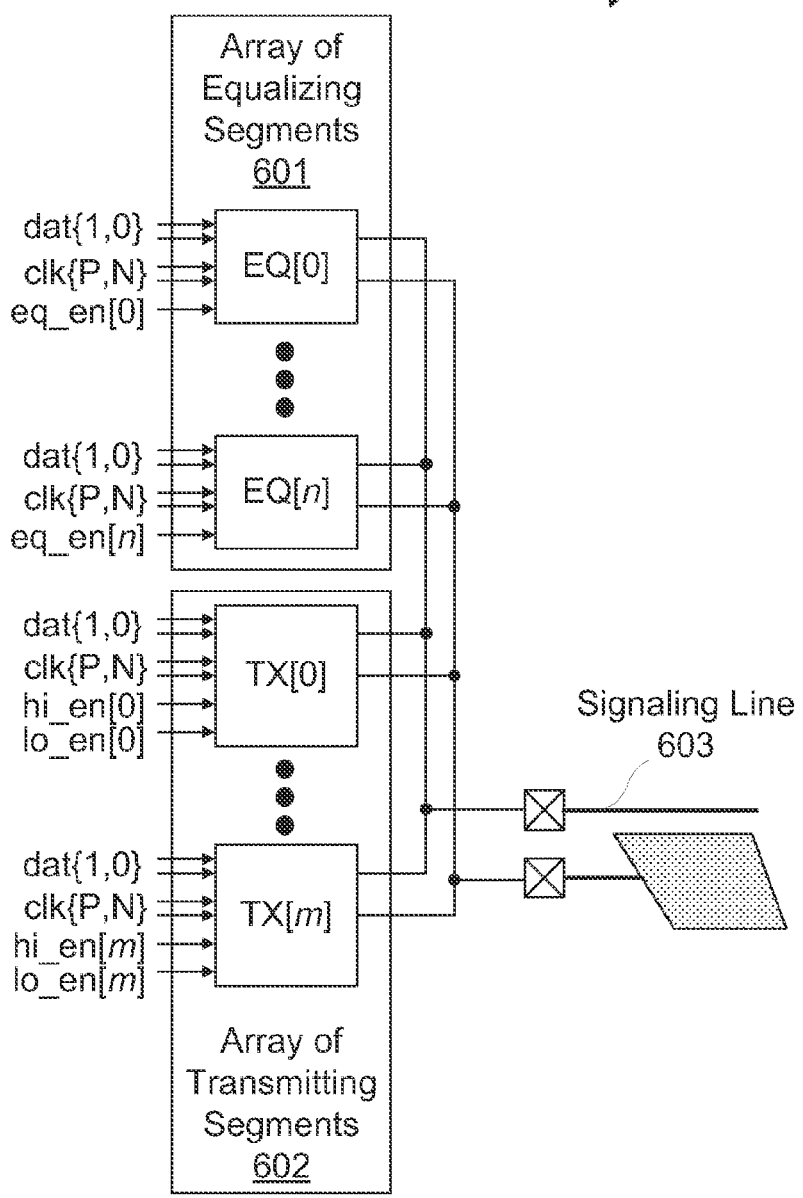
FIG. 6A outlines a bridge transmitter with digitally adjustable offset and equalization, according to another embodiment of the present disclosure.

Returning to the problem that the flying-capacitor charge pump may have different efficiencies for driving HI and driving LO, FIG. 6A illustrates an equalized data-driven charge-pump transmitter, bridge transmitter with digitally adjustable offset and equalization 600, according to another embodiment of the present disclosure. This bridge transmitter with digitally adjustable offset and equalization 600 consists of two parts: an array of equalizing segments 601 and an array of transmitter segments 602. The bridge transmitter with digitally adjustable offset and equalization 600 drives the signaling line 603.

The individual equalizing segments EQ[0] through EQ[n] of the array of equalizing segments 601 may be separately enabled by means of the control signals eq_en[n . . . 0], and the equalizing segments may be equal in size, binary weighted, or otherwise sized to allow the effective equalization constant to be varied by changing the digital code on eq_en[n . . . 0]. Each transmitter segment TX[0] through TX[m] in the array of transmitting segments 602 may be separately enabled for driving HI or LO by setting the digital values of hi_en[m . . . 0] and lo_en[m . . . 0].

Figure 6B:
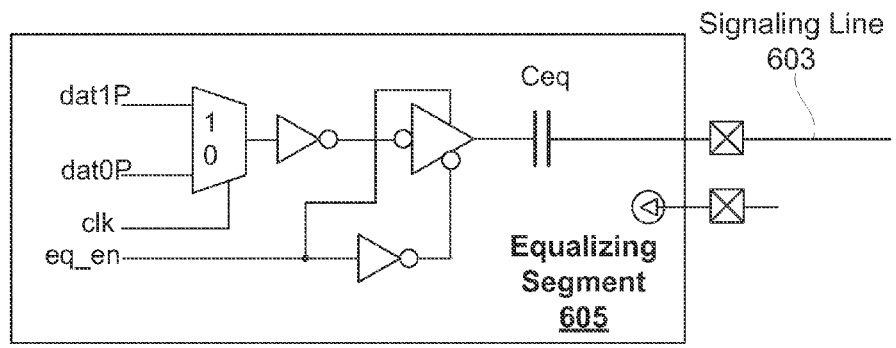
FIG. 6B illustrates an equalizing segment circuit of FIG. 6A, according to one embodiment of the present disclosure

FIG. 6B illustrates an equalizing segment circuit 605 of the array of equalizing segments 601 shown in FIG. 6A, according to one embodiment of the present disclosure. The equalizing segment 605 is similar in design to the equalizer 435 shown in FIG. 4D, apart from the output driver inverter, which can be enabled or disabled via the control signal eq_en. When disabled, the drive end of the equalizing capacitor Ceq is undriven, so that the output capacitance of a disabled equalizing segment does not present a load to the overall transmitter.

Figure 6C:
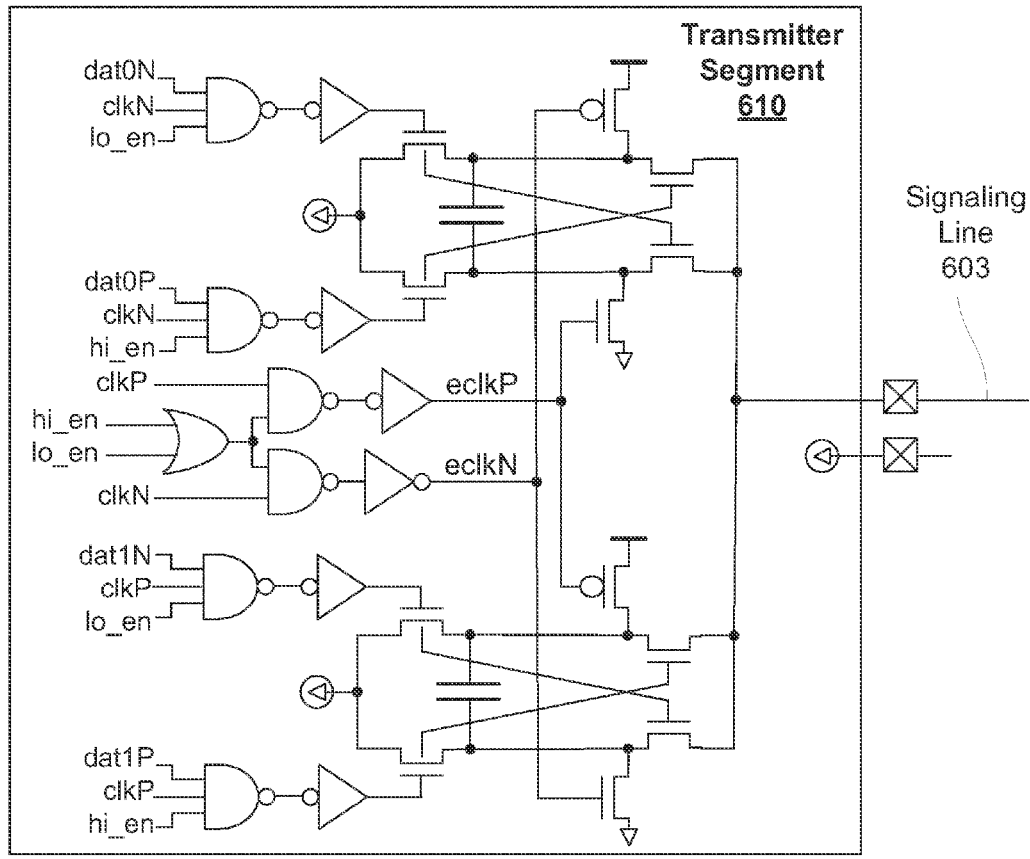
FIG. 6C illustrates an transmitter segment circuit of FIG. 6A, according to one embodiment of the present disclosure.

FIG. 6C illustrates a transmitter segment circuit 610 of the array of transmitting segments 602 shown in FIG. 6A, according to one embodiment of the present disclosure. The data-driven charge-pump transmitter segment 602 is similar in design to the bridge transmitter with pre-computing gates 550 shown in FIG. 5D. However, the pre-computing gates have been enhanced with enable controls lo_en and hi_en, which separately enable the portion of the driver which drives the output signal LO and HI, respectively. Likewise the internal precharge clocks are gated so that if either lo_en or hi_en is asserted, the precharge clocks eclkP and eclkN are allowed to toggle, Each transmitter segment 610 in the array of transmitting segments 602 may be separately enabled for driving HI or LO by setting the digital values of hi_en[m . . . 0] and lo_en[m . . . 0]. Because the enable controls may be set independently, the driver may be compensated for asymmetric drive, thereby cancelling the output voltage offset of the bridge transmitter with digitally adjustable offset and equalization 600. Furthermore, if the maximum voltage that is required to be driven into the signaling line 603 is less that the maximum voltage that the array of transmitting segments 602 can supply, one or more transmitter segments 610 in the array of transmitting segments 602 can be completely disabled, thereby saving operating power. The transmitter segments 610 in the array of transmitting segments 602 can be sized equally, can be binary-weighted in size, or sized in any other convenient way to allow the output drive strength for HI and LO to be adjusted independently. Finally, the number of equalizing segments 605 that are enabled relative to the number of transmitter segments 610 that are enabled sets the equalization strength for the bridge transmitter with digitally adjustable offset and equalization 600, allowing the equalization constant of the bridge transmitter with digitally adjustable offset and equalization 600 to be tuned to match the attenuation in the channel comprised of signaling line 603.

Figure 6D:
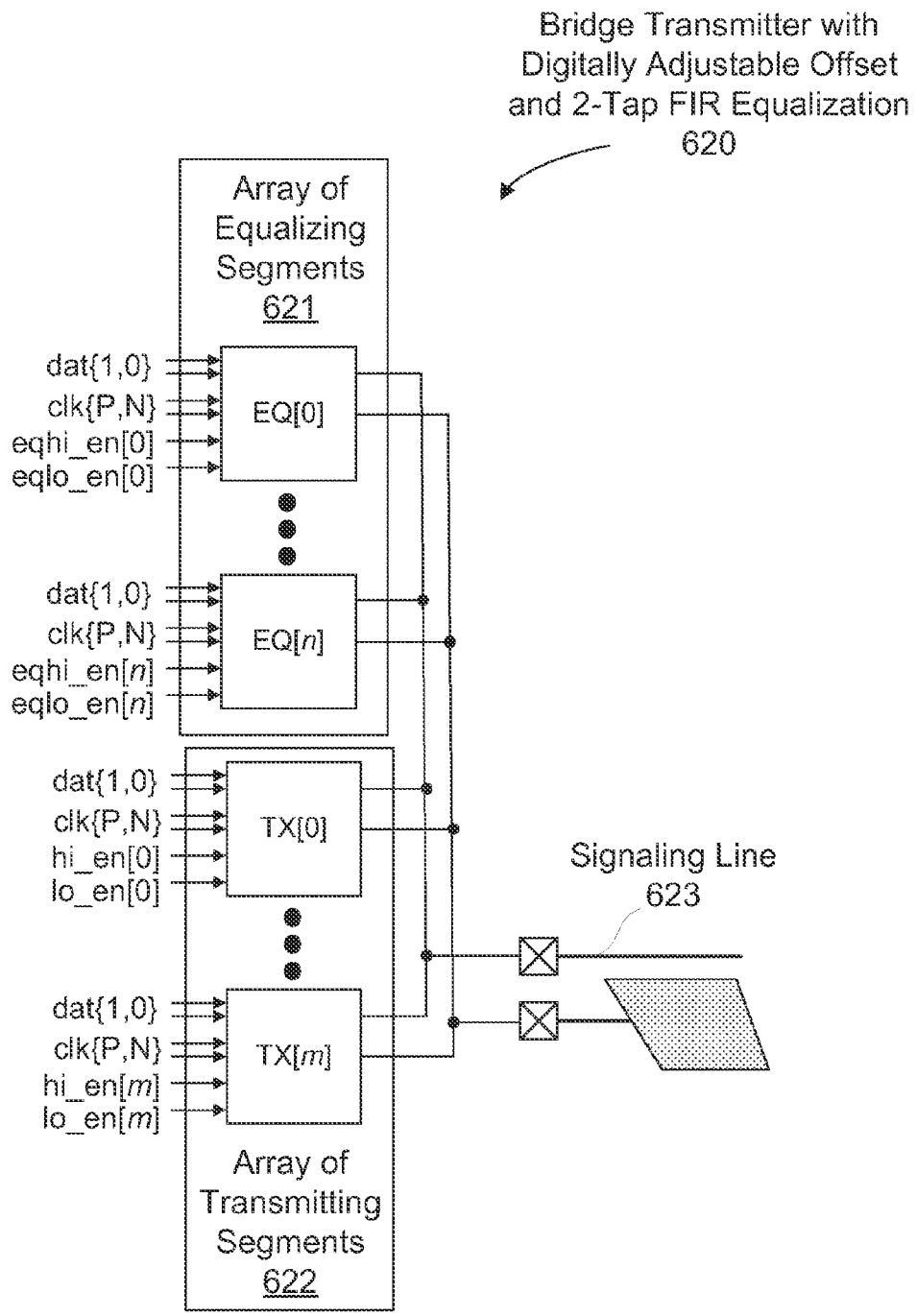
FIG. 6D outlines a bridge transmitter with digitally adjustable offset and 2-tap FIR equalization, according to another embodiment of the present disclosure.

FIG. 6D outlines a bridge transmitter with digitally adjustable offset and 2-tap finite impulse response (FIR) equalization 620, according to another embodiment of the present disclosure. The bridge transmitter with digitally adjustable offset and 2-tap FIR equalization 620 is composed of an array of equalizing segments 621 and an array of transmitter segments 622. Each transmitter segment TX[0] through TX[m] in the array of transmitter segments 622 are identical to the transmitter segment 610 shown in FIG. 6C, and the HI and LO drive enables work in the same manner. The equalizing segments EQ[0] through EQ[n] in the array of equalizing segments 621 are similar to the equalizing segment 605 shown in FIG. 6B, except that the equalizing segments in the array of equalizing segments 621 are modified with the addition of logical elements on their data inputs.

Figure 6E:
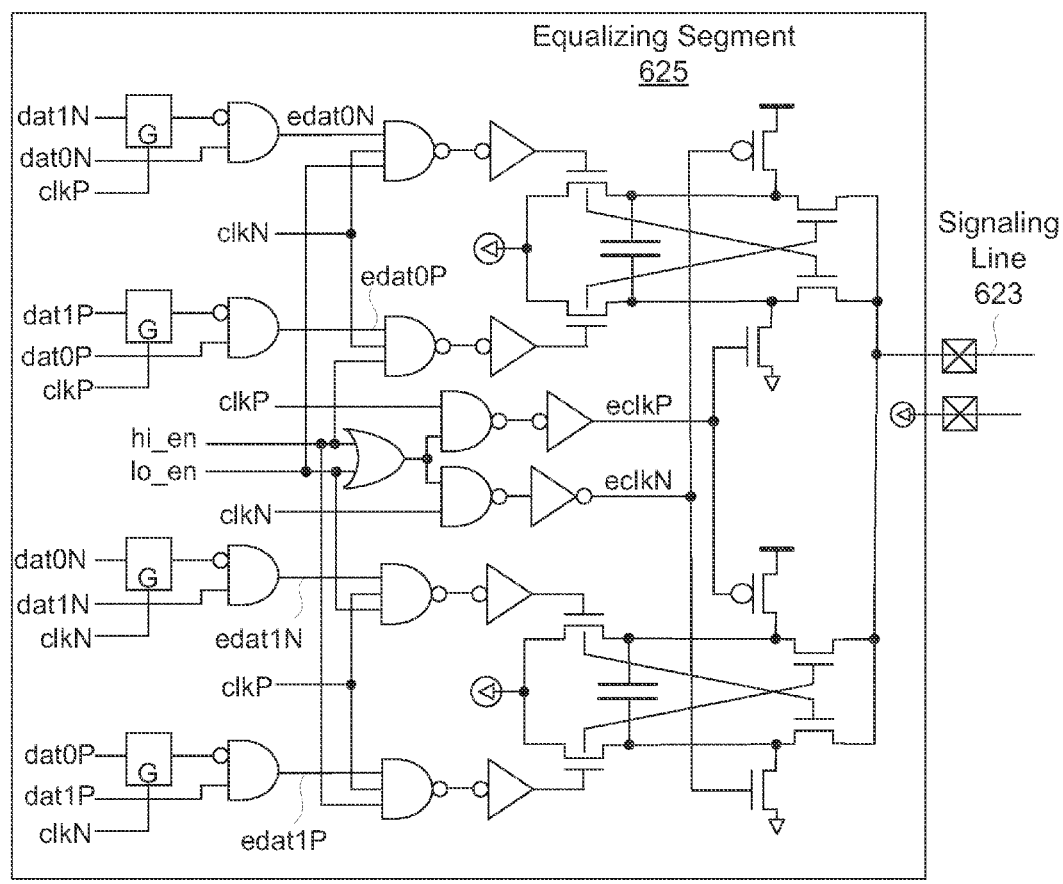
FIG. 6E illustrates an equalizing segment circuit of FIG. 6D, according to one embodiment of the present disclosure.

FIG. 6E illustrates an equalizing segment circuit of FIG. 6D, according to one embodiment of the present disclosure. The upper half of the equalizing segment 625 drives the signaling line 623 when clkN=1, according to the values on edat0N and edat1N. edat0N is asserted when dat0N=1 AND the previous dat1N=0, and in this case the upper half of the equalizing segment 625 drives the signaling line 623 output HI when clkN=1. Likewise edat0P is asserted when dat0P=1 AND the previous dat1P=0, and in this case the upper half of the equalizing segment 625 drives the signaling line 623 output LO when clkN=1. Otherwise neither of edat0{P,N} is asserted, and the upper half of the circuitry in the equalizing segment 625 outputs no current. The lower half of the circuitry in the equalizing segment 625 operates in the same manner, but by comparing the present value of dat0 with the previous value of dat1 and clocking current onto the line on clkP=1. In short, the equalizing segments 625 output a current pulse whenever there is a change in data value, otherwise no current is output. This implements a simple 2-tap pre-emphasis FIR filter.

While the foregoing discussion relating to FIG. 6D describes a 2-tap FIR filter, the technique can be extended to additional taps by adding additional groups of equalization segments 625, and comparing a bit-history that spans more than 2 successive bits. Furthermore, while the foregoing examples of data-driven charge-pump transmitters are described in terms of 2:1 multiplexing embodiments, higher multiplexing, such as 4:1 multiplexing, is also possible, provided that appropriate clock phases and parallel data bits are available.

Receiver Circuitry for Single-Ended Signaling

Returning to the ground-referenced single-ended signaling system 300, data-driven charge-pump transmitters 400, 410, 420, and 430, the switched capacitor transmitter 500, the "bridge" charge pump transmitter 540, and the pre-computing gates 550 are paired with a receiver that can efficiently receive signals that swing symmetrically about GND (0V). The receiver amplifies and level-shifts the signals to CMOS levels (logic levels that toggle roughly between Vdd and GND).

Figure 7A:
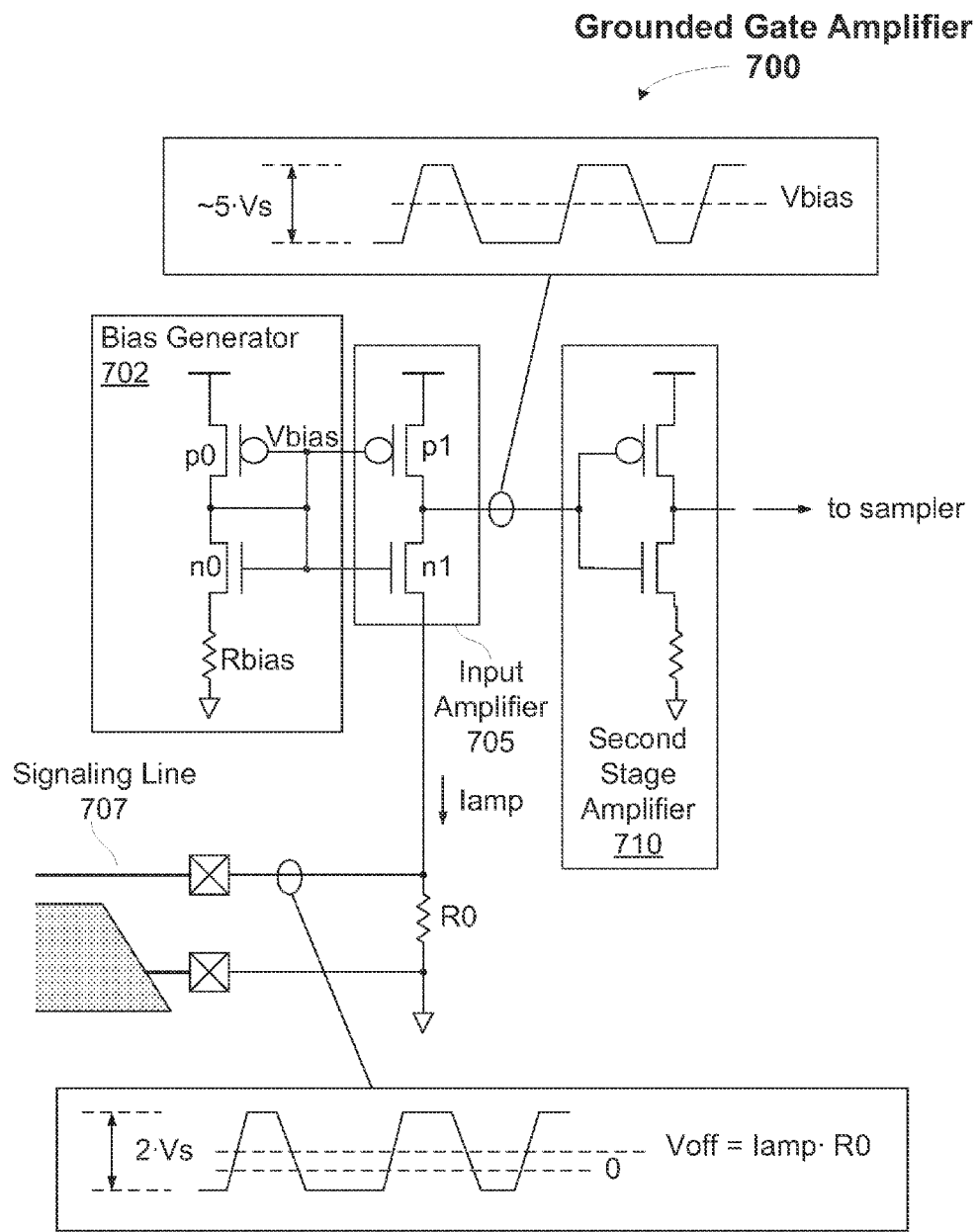
FIG. 7A illustrates a grounded-gate amplifier, according to one embodiment of the present disclosure.

While a conventional PMOS differential amplifier could be used as a receiver, a lower power and simpler alternative is a grounded-gate (or common gate) amplifier. FIG. 7A illustrates a grounded-gate amplifier 700, according to one embodiment of the present disclosure. If p0/p1 and n0/n1 are drawn the same size, then p0/n0, a shorted inverter forming the bias generator 702, produces the bias voltage Vbias which sits at the inverter switching threshold. The input amplifier 705 that includes p1/n1, in the absence of a signal on the signaling line 707, sits at the same operating point, specifically the inverter switching threshold, so the output of the input amplifier 705 also rests at V(Vbias). The input amplifier 705 sources current Iamp into the signaling line 707. Therefore, the voltage on the signaling line 707 swings around not 0v (GND) but rather the offset voltage Voff=Iamp·R0, in the case where only the receiver is terminated. When both ends of the signaling line 707 are terminated, Voff=0.5 Iamp·R0, and the bias resistor Rbias that is attached to the source of n0 is set at R0/2. In practice the offset voltage will be small compared to the signal swing Vs. Note that the biasing circuit p0/n0 and the bias resistor of the bias generator 702 can be scaled down to save power.

In a conventional process technology, if the MOSFETs of the grounded-gate amplifier 700 are implemented using low-threshold devices, the input amplifier 705 has a gain of about 5, so that when the signaling line 707 has an amplitude of 100 mV, the input amplifier 705 can produce an output voltage level that is nearly sufficiently large-swing to drive a CMOS sampler directly. If more gain is required, a second stage amplifier 710 can be added. Both the output of the input amplifier 705, and the output of a successive amplifier, such as the second stage amplifier 710, swing roughly symmetrically around V(Vbias), the inverter switching threshold, roughly half-way between Vdd and GND.

The foregoing explanation ignores an effect inherent in grounded-gate amplifiers. Because a grounded-gate amplifier drives current into the input, e.g., the signaling line, the grounded-gate amplifier has a finite input impedance that is roughly 1/gm of the input transistor n1. The impedance appears in parallel with the termination resistor R0, so the input will be under-terminated unless the termination resistor is adjusted upward. In practice, the input amplifier 705 can be drawn small enough that the effect is relatively small.

The foregoing description of the grounded-gate amplifier 700 implicitly assumes that p0 and p1 are matched, and n0 and n1 are matched. Inevitably, process variation, and differences in input source resistors Rbias and R0 will cause Vbias to move away from the actual switching threshold of p1/n1, thereby introducing an offset in the voltage at the output of input amplifier 705. The output of input amplifier 705, instead of swinging symmetrically about Vbias, as shown in FIG. 7A, will be displaced above or below the ideal swing.

Figure 7B:
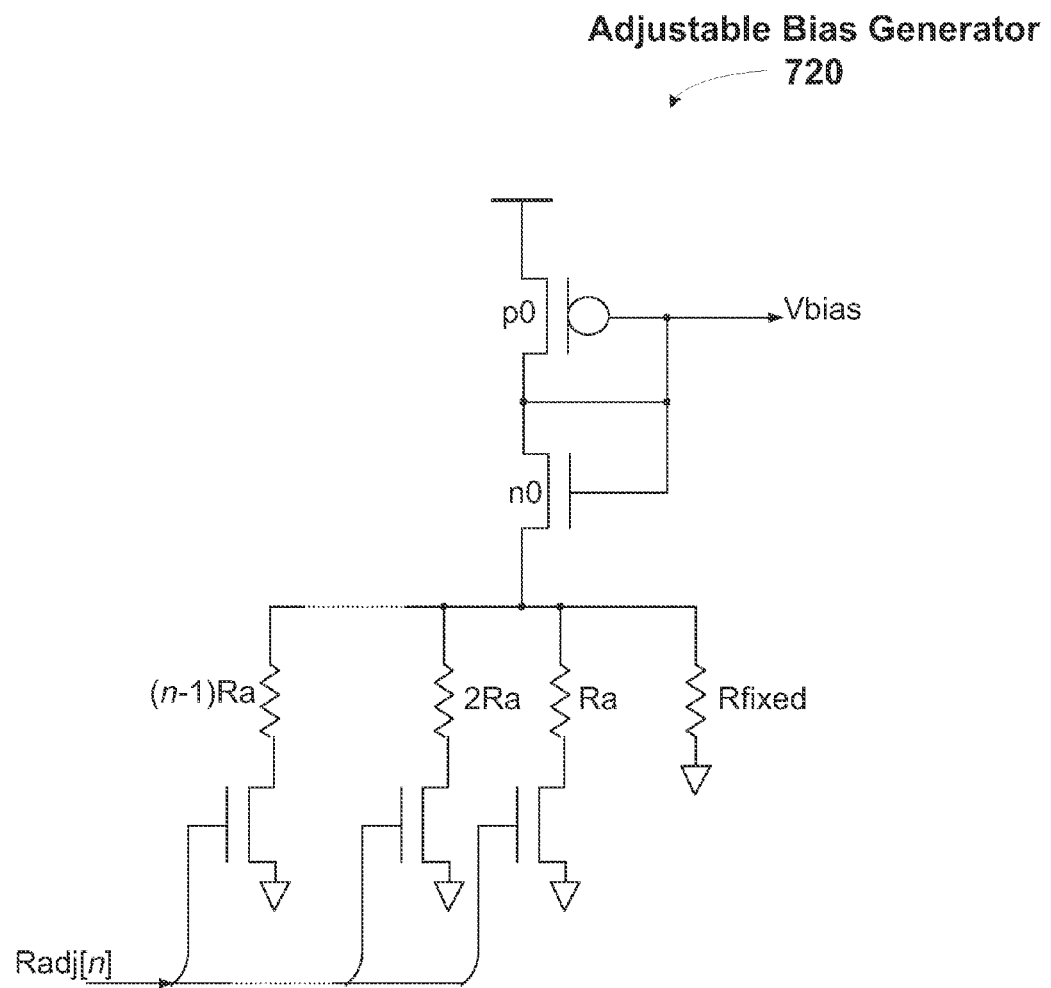
FIG. 7B illustrates an adjustable bias generator, according to one embodiment of the present disclosure.

To remove the introduced offset, an offset trim mechanism may be used, and a procedure for adjusting the mechanism may be employed. One of several possible ways to implement the offset trim mechanism is to modify the bias generator. FIG. 7B illustrates an adjustable bias generator 720, according to one embodiment of the present disclosure.

The adjustable bias generator 720 may replace the bias generator 702 in the grounded-gate amplifier 700. The single source resistor Rbias in the bias generator 702 within the grounded-gate amplifier 700 is replaced by an adjustable resistor that can be trimmed digitally by changing the value of the Radj[n] bus of signals. A fixed resistor Rfixed sets the maximum resistance of the adjustable resistor, and a set of binary-weighted resistors Ra, 2Ra . . . (n−1)Ra that can be selectively paralleled with Rfixed to lower the effective resistance. These resistors would typically be chosen so that when Radj[n] is at mid-range, the overall resistance matches the termination resistance R0. Alternatively, instead of adjusting Rbias, one or both of the transistors p0/n0 could be adjusted in a similar way, by providing a plurality of bias transistors in series with control transistors to allow the effective widths of the bias transistors to be varied digitally.

With a digital trim mechanism established, a procedure for adjusting the mechanism to remove the introduced offset is needed. The method described herein requires no additional hardware beyond that required for the grounded-gate amplifier 700 to perform the receiving operations, apart from a finite-state machine to analyze the data from the receiver samplers and set the trim value onto the adjustment bus Radj[n].

Figure 7C:
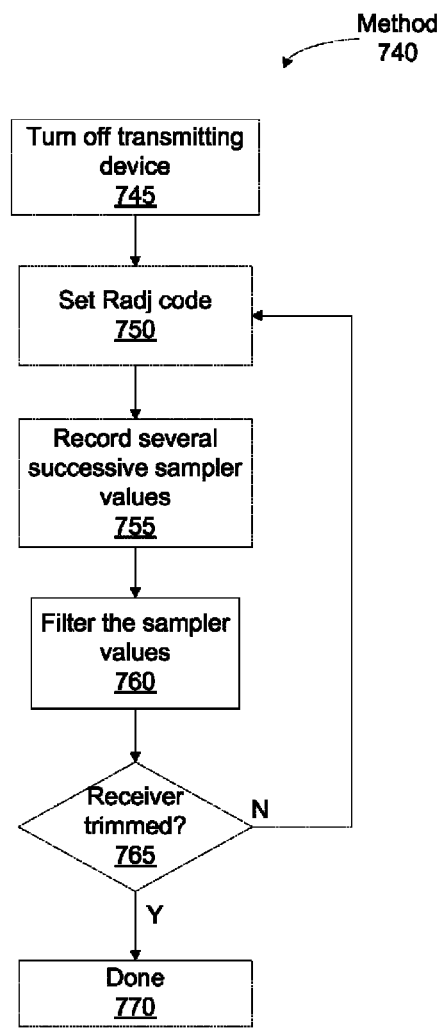
FIG. 7C illustrates a method for adjusting an offset trim mechanism, according to one example embodiment of the present disclosure.

FIG. 7C illustrates a method 740 for adjusting an offset trim mechanism, according to one example embodiment of the present disclosure. Although the method steps are described in conjunction with the system of FIG. 7B, persons of ordinary skill in the art will understand that any system configured to perform the method steps, in any order, is within the scope of the disclosure.

The method 740 is performed to adjust the adjustable bias generator 720. At step 745 the transmitting device that drives the signaling line is turned off, so that the signaling line settles to its mid-point voltage, Voff. At step 750 the Radj code that varies resistor Rbias is set. In step 755, the finite state machine that controls Radj records several successive samples from the receiver sampler or samplers that are attached to the input amplifier, with receiver clocks toggling. Next, in step 760, these values are filtered to determine whether the average value is greater than or less than 0.5. At step 765, the Radj code is changed to drive the offset toward the point where half of the sampler values are "1" and half are "0". Until this point is reached the procedure returns to step 750 and readjusts the Radj code. When it is determined that the average value from the samplers is "dithering" near 0.5, the receiver is assumed to be trimmed, and the procedure exits at step 770.

At step 750 the finite-state machine starts with the Radj code at one extreme, and marches the code on Radj toward the other extreme. At the starting point, all of the samplers should be outputting either "1" or "0" depending on the details of the receiver. As the code on Radj changes toward the other extreme, there will be a point at which the digital values from the samplers begin to toggle to the opposite digital value.

At step 760 the finite-state machine filters the values from the samplers by averaging over a number of clock cycles. When the values from the 4 samplers is half "1's" and half "0's", averaged over some number of sampling clock periods, the receiver can be assumed to be trimmed. The finite-state machine may be implemented in hardware, software, or a combination of hardware and software running on a control processor.

Variations on this scheme might include equal weighting of the Ra resistors, and thermometer-coding the Radj bus. This implementation might be helpful if it is necessary to perform a trim operation during the reception of live data, using some other procedure than the one described above. Another possible variation: if the multiple samplers in the receiver require individual offset trim, four copies of the input amplifier could be provided (though sharing a common termination resistor), and four trim-able Vbias generators included, each with its own Radj bus. The trim procedure would be much like the one described above, except that either multiple finite-state machines, or a time-multiplexed procedure, would be needed to perform the adjustment.

System Overview

Figure 8A:
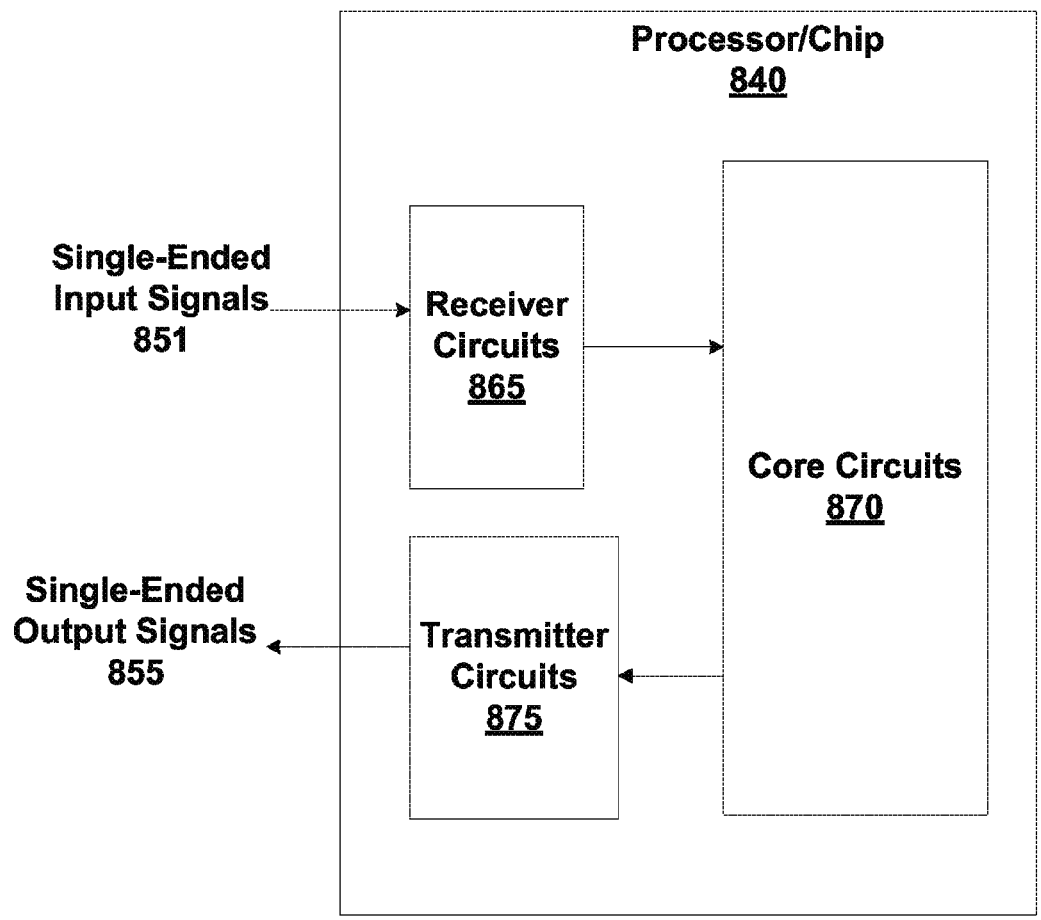
FIG. 8A is a block diagram illustrating a processor/chip including the transmitter and receiver circuits for ground referenced single-ended signaling, in accordance with one or more aspects of the present disclosure.

FIG. 8A is a block diagram illustrating a processor/chip 840 including a ground-referenced single-ended signaling transmitter such as the data-driver charge-pump transmitter 410 from FIG. 4B, 420 from FIG. 4C, 430 from FIG. 4D, the switched-capacitor transmitter 500 from FIG. 5A, the bridge charge pump transmitter 540 from FIG. 5O, or the bridge transmitter with pre-computing gates 550 from FIG. 5D, in accordance with one or more aspects of the present disclosure. Receiver circuits 865 may include receivers configured to receive single-ended input signals from other devices in a system, such as the grounded gate amplifier 700 from FIG. 7A. Single-ended output signals 855 are produced by the transmitter circuits 875. The receiver circuits 865 provide inputs to the core circuits 870. The core circuits 870 may be configured to process the input signals and generate outputs. The outputs of the core circuits 870 are received by the transmitter circuits 875 and used to generate the single-ended output signals 855.

Figure 8B:
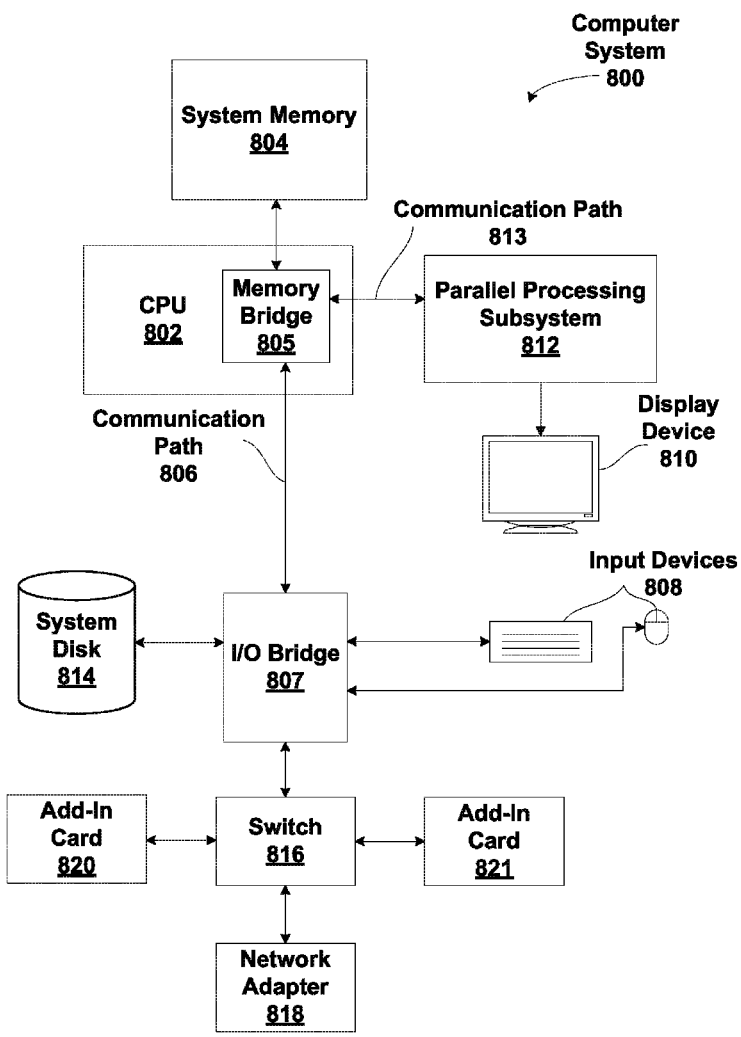
FIG. 8B is a block diagram illustrating a computer system configured to implement one or more aspects of the present disclosure.

FIG. 8B is a block diagram illustrating a computer system 800 configured to implement one or more aspects of the present invention. Computer system 800 includes a central processing unit (CPU) 802 and a system memory 804 communicating via an interconnection path that may include a memory bridge 805. Memory bridge 805, which may be, e.g., a Northbridge chip, is connected via a bus or other communication path 806 (e.g., a HyperTransport link) to an I/O (input/output) bridge 807. I/O bridge 807, which may be, e.g., a Southbridge chip, receives user input from one or more user input devices 808 (e.g., keyboard, mouse) and forwards the input to CPU 802 via communication path 806 and memory bridge 805. A parallel processing subsystem 812 is coupled to memory bridge 805 via a bus or second communication path 813 (e.g., a Peripheral Component Interconnect (PCI) Express, Accelerated Graphics Port, or HyperTransport link); in one embodiment parallel processing subsystem 812 is a graphics subsystem that delivers pixels to a display device 810 (e.g., a conventional cathode ray tube or liquid crystal display based monitor). A system disk 814 is also connected to I/O bridge 807. A switch 816 provides connections between I/O bridge 807 and other components such as a network adapter 818 and various add-in cards 820 and 821. Other components (not explicitly shown), including universal serial bus (USB) or other port connections, compact disc (CD) drives, digital video disc (DVD) drives, film recording devices, and the like, may also be connected to I/O bridge 807. The various communication paths shown in FIG. 8B, including the specifically named communication paths 806 and 813 may be implemented using any suitable protocols, such as PCI Express, AGP (Accelerated Graphics Port), HyperTransport, or any other bus or point-to-point communication protocol(s), and connections between different devices may use different protocols as is known in the art.

One or more of the devices shown in FIG. 88 may receive or transmit signals using single-ended signaling. In particular, transmitting devices may be configured to include a ground-referenced single-ended signaling transmitter such as the data-driver charge-pump transmitter 410 from FIG. 4B, 420 from FIG. 4C, 430 from FIG. 4D, the switched-capacitor transmitter 500 from FIG. 5A, the bridge charge pump transmitter 540 from FIG. 5C, or the bridge transmitter with pre-computing gates 550 from FIG. 5D. Receiving devices may be configured to include the grounded gate amplifier 700 from FIG. 7A.

In one embodiment, the parallel processing subsystem 812 incorporates circuitry optimized for graphics and video processing, including, for example, video output circuitry, and constitutes a graphics processing unit (GPU). In another embodiment, the parallel processing subsystem 812 incorporates circuitry optimized for general purpose processing, while preserving the underlying computational architecture, described in greater detail herein. In yet another embodiment, the parallel processing subsystem 812 may be integrated with one or more other system elements in a single subsystem, such as joining the memory bridge 805, CPU 802, and I/O bridge 807 to form a system on chip (SoC).

It will be appreciated that the system shown herein is illustrative and that variations and modifications are possible. The connection topology, including the number and arrangement of bridges, the number of CPUs 802, and the number of parallel processing subsystems 812, may be modified as desired. For instance, in some embodiments, system memory 804 is connected to CPU 802 directly rather than through a bridge, and other devices communicate with system memory 804 via memory bridge 805 and CPU 802. In other alternative topologies, parallel processing subsystem 812 is connected to I/O bridge 807 or directly to CPU 802, rather than to memory bridge 805. In still other embodiments, I/O bridge 807 and memory bridge 805 might be integrated into a single chip instead of existing as one or more discrete devices. Large embodiments may include two or more CPUs 802 and two or more parallel processing systems 812. The particular components shown herein are optional; for instance, any number of add-in cards or peripheral devices might be supported. In some embodiments, switch 816 is eliminated, and network adapter 818 and add-in cards 820, 821 connect directly to I/O bridge 807.

In sum, a mechanism for transmitting and receiving ground-referenced single-ended signals combines a DC to DC converter including a flying capacitor with a 2:1 multiplexer to drive a single-ended signaling line. The transmitter drives a pair of voltages that are symmetric about the ground power supply level. Signaling currents are returned to the ground plane, a plane at the positive supply voltage, or at plane at a voltage level that is not a supply voltage, to minimize the generation of noise that is a source of crosstalk between different single-ended signaling lines. Noise introduced through the power supply is correlated with the switching rate of the data and may be reduced using an equalizer circuit. The transmitter provides a mechanism for single-ended signaling while reducing the problems of establishing a reference voltage, reducing the impedance of the signal return path, and reducing the power supply noise present in conventional single-ended signaling circuits.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A transmitter circuit, comprising:
    a precharge with flying capacitor sub-circuit that includes a first flying capacitor configured to be precharged to a ground supply voltage during a positive phase of a clock and a second flying capacitor configured to be precharged to the ground supply voltage during a negative phase of the clock; and
    a discharge and multiplexor sub-circuit that is configured to:
        couple the first flying capacitor to a single-ended signaling line during the negative phase of the clock to drive the single-ended signaling line based on a first data signal; and
        couple the second flying capacitor to the single-ended signaling line during the positive phase of the clock to drive the single-ended signaling line based on a second data signal.

2. The transmitter circuit of claim 1, wherein the discharge and multiplexor sub-circuit is further configured to discharge the first flying capacitor through a signal current return network when the first data signal is low during the negative phase of the clock and drive the single-ended signaling line low.

3. The transmitter circuit of claim 1, wherein the discharge and multiplexor sub-circuit is further configured to transfer charge stored on the first flying capacitor to the single-ended signaling line to drive the single-ended signaling line high when the first data signal is high during the negative phase of the clock.

4. The transmitter circuit of claim 1, wherein the discharge and multiplexor sub-circuit is further configured to discharge the second flying capacitor through a signal current return network when the second data signal is low during the positive phase of the clock and drive the single-ended signaling line low.

5. The transmitter circuit of claim 1, wherein the discharge and multiplexor sub-circuit is further configured to transfer charge stored on the second flying capacitor to the single-ended signaling line to drive the single-ended signaling line high when the second data signal is high during the positive phase of the clock.

6. The transmitter circuit of claim 1, wherein the precharge with flying capacitor sub-circuit comprises:
    the first flying capacitor having a first terminal coupled to a power supply voltage through a first clock-enabled transistor that is activated during the positive phase of the clock, and having a second terminal coupled to the ground supply voltage through a second clock-enabled transistor that is also activated during the positive phase of the clock; and
    the second flying capacitor having a first terminal coupled to the ground supply voltage through a third clock-enabled transistor that is activated during the negative phase of the clock, and having a second terminal coupled to a power supply voltage through a fourth clock-enabled transistor that is also activated during the negative phase of the clock.

7. The transmitter circuit of claim 1, further comprising an equalizer that is coupled to the single-ended signaling line and configured to push additional current to or pull additional current from the single-ended signaling line, boosting the voltage of the single-ended signaling line when a data signal transmitted on the single-ended signaling line transitions from low to high or from high to low.

8. The transmitter circuit of claim 1, wherein return current from a receiving device that is coupled to the single-ended signaling line is returned to a signal current return network.

9. The transmitter circuit of claim 1, wherein the ground supply voltage coupled to the precharge with flying capacitor sub-circuit is separate from a signal ground supply voltage that is coupled to the discharge and multiplexor sub-circuit.

10. The transmitter circuit of claim 1, further comprising pre-computing gates that are configured to combine positive and negative versions of the first data with the clock to generate outputs that are coupled to the discharge and multiplexor sub-circuit.

11. The transmitter circuit of claim 1, wherein the single-ended signaling line is driven to either a positive or a negative voltage level that is symmetric around a common reference voltage level to transmit a high signal or a low signal, respectively.

12. The transmitter circuit of claim 1, further comprising a regulator loop circuit that is configured to provide a regulated power supply voltage to the precharge with flying capacitor sub-circuit and the discharge and multiplexor sub-circuit, wherein the regulated power supply voltage is lower than the lowest expected voltage of a power supply voltage of a transmitting device that includes the transmitter circuit.

13. The transmitter circuit of claim 1, wherein the single-ended signaling line is coupled to a receiver circuit and the receiver circuit comprises:
    an input amplifier that is coupled to the single-ended signaling line; and
    a bias generator that is coupled to the input amplifier and comprises an inverter circuit having an input coupled to an output of the inverter circuit and a bias resistor coupled between the inverter circuit and the ground power supply.

14. The transmitter circuit of claim 1, wherein the precharge with flying capacitor sub-circuit further comprises a third flying capacitor that is coupled to the first flying capacitor and configured to be precharged to a supply voltage during the positive phase of the clock.

15. A method comprising:
    precharging a first flying capacitor to a ground supply voltage during a positive phase of a clock;
    precharging a second flying capacitor to the ground supply voltage during a negative phase of the clock;
    coupling the first flying capacitor to a single-ended signaling line during the negative phase of the clock to drive the single-ended signaling line based on a first data signal; and
    coupling the second flying capacitor to the single-ended signaling line during the positive phase of the clock to drive the single-ended signaling line based on a second data signal.

16. The method of claim 15, wherein return current from a receiving device that is coupled to the single-ended signaling line is returned to a signal current return network.

17. The method of claim 15, wherein the ground supply voltage coupled to a precharge with flying capacitor sub-circuit that is configured to precharge the first flying capacitor and discharge the second flying capacitor is separate from a signal ground supply voltage that is coupled to a discharge and multiplexor sub-circuit that is configured to discharge the first flying capacitor and discharge the second flying capacitor.

18. The method of claim 15, wherein the single-ended signaling line is driven to either a positive or a negative voltage level that is symmetric around a common reference voltage level to transmit a high signal or a low signal, respectively.

19. The method of claim 15, further comprising pushing additional current to or pulling additional current from the single-ended signaling line to boost a voltage of the single-ended signaling line when a data signal transmitted on the single-ended signaling line transitions from low to high or from high to low.

20. The method of claim 15, further comprising combining positive and negative versions of the first data signal with the clock to couple the first flying capacitor to the single-ended signaling line during the negative phase of the clock.

\* \* \* \* \*